United States Patent
Wang

(10) Patent No.: US 11,532,793 B2
(45) Date of Patent: Dec. 20, 2022

(54) COMPOUND, DISPLAY PANEL, AND DISPLAY APPARATUS

(71) Applicant: WuHan TianMa Micro-electronics CO., LTD., Wuhan (CN)

(72) Inventor: Kui Wang, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 405 days.

(21) Appl. No.: 16/818,988

(22) Filed: Mar. 13, 2020

(65) Prior Publication Data

US 2021/0184122 A1    Jun. 17, 2021

(30) Foreign Application Priority Data

Dec. 13, 2019    (CN) .......................... 201911281558.0

(51) Int. Cl.
*H01L 51/00*    (2006.01)
*C07F 5/02*    (2006.01)
(Continued)

(52) U.S. Cl.
CPC ............ *H01L 51/008* (2013.01); *C07F 5/027* (2013.01); *C09K 11/06* (2013.01);
(Continued)

(58) Field of Classification Search
CPC ............... H01L 51/008; H01L 51/0059; H01L 51/0065; H01L 51/0068; H01L 51/5012;
(Continued)

(56) References Cited

U.S. PATENT DOCUMENTS

2018/0013064 A1* 1/2018 Wu ........................ H01L 51/008

FOREIGN PATENT DOCUMENTS

CN        109438446 A      3/2019
WO    WO-2020/135687 A1 *  7/2020

OTHER PUBLICATIONS

Machine translation WO-2020135687-A1 (publication date: Jul. 2020). (Year: 2020).*

(Continued)

*Primary Examiner* — Dawn L Garrett
(74) *Attorney, Agent, or Firm* — Christensen O'Connor Johnson Kindness PLLC

(57) ABSTRACT

The present disclosure provides a boron heterocyclic compound having a structure represented by a chemical formula 1, wherein $L_1$ and $L_2$ are each independently selected from the group consisting of C6-C30 aryl, C6-C30 fused aryl, C4-C30 heteroaryl, and C4-C30 fused heteroaryl; and $R_1$ and $R_2$ are each independently selected from the group consisting of carbazolyl, a carbazolyl-derived group, acridinyl, an acridinyl-derived group, diarylamino, and a diarylamino-derived group. The double boron heterocyclic structure functions as an electron acceptor and a linker. In the present disclosure, by attaching a group having a large steric hindrance to the boron atom of the boron heterocyclic ring, the molecules the compound are prevented from aggregating, and thus a π-aggregation or excimer formed by direct accumulation of the conjugate plane is avoided, thereby improving the light-emitting efficiency. The present disclosure further provides a display panel and a display apparatus.

(Continued)

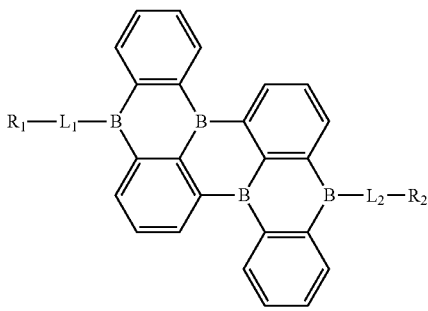

chemical formula 1

18 Claims, 2 Drawing Sheets

(51) Int. Cl.
  *C09K 11/06* (2006.01)
  *H01L 51/50* (2006.01)
(52) U.S. Cl.
  CPC ...... *H01L 51/0059* (2013.01); *H01L 51/0065* (2013.01); *H01L 51/0068* (2013.01); *C09K 2211/1018* (2013.01); *H01L 51/5012* (2013.01)

(58) Field of Classification Search
  CPC ............. H01L 51/0037; H01L 51/0052; H01L 51/0056; H01L 51/0058; H01L 51/006; H01L 51/0061; H01L 51/0067; H01L 51/007; H01L 51/0071; H01L 51/0072; C07F 5/027; C09K 11/06; C09K 2211/1018; C09K 2211/1007; C09K 2211/1011; C09K 2211/1014; C09K 2211/1029; C09K 2211/1048; C09K 2211/1059; C09K 2211/1088; C09K 2211/1092; C09K 2211/1096
  See application file for complete search history.

(56) References Cited

OTHER PUBLICATIONS

Radtke et al., Chemical Science, (2019), 10(39), pp. 9017-9027. (Year: 2019).*
John et al., Journal of Materials Chemistry C, (2018), vol. 6, pp. 10881-10887. (Year: 2018).*
Hirai et al., Chemical Reviews, (2019), vol. 119, pp. 8291-8331 (Year: 2019).*

* cited by examiner

COMPOUND, DISPLAY PANEL, AND DISPLAY APPARATUS

CROSS-REFERENCE TO RELATED APPLICATIONS

The present disclosure claims priority to Chinese Patent Application No. 201911281558.0, filed on Dec. 13, 2019, the content of which is incorporated herein by reference in its entirety.

TECHNICAL FIELD

The present disclosure relates to the technical field of organic electroluminescent materials, in particular to a compound, a display panel including the compound, and a display apparatus.

BACKGROUND

With the development of electronic display technology, Organic Light-Emitting Diodes (OLEDs) are widely used in various display apparatuses. Especially in recent years, the demand for OLEDs in the smartphone industry has been increasing, and research on the light-emitting materials of OLEDs are also more extensive.

Based on the light-emitting mechanism, materials for a light-emitting layer of an OLED can be generally divided into four types:

(1) fluorescent materials; (2) phosphorescent materials; (3) triplet-triplet annihilation (TTA) materials; (4) thermally activated delayed fluorescence (TADF) materials.

Regarding the fluorescent materials, according to spin-statistics, a ratio of singlet excitons to triplet excitons is 1:3, and, thus, the maximum internal quantum yield of fluorescent materials does not exceed 25%. According to the Lambertian luminescence mode, the light extraction efficiency is about 20%, and, thus, an external quantum efficiency (EQE) of the OLED device based on the fluorescent material does not exceed 5%.

With respect to the phosphorescent materials, an intersystem crossing of molecules can be enhanced due to a heavy atom effect of the phosphorescent materials, and 75% of triplet excitons can be directly utilized to complete emission involving both S and T1 at room temperature, where a theoretical maximum internal quantum yield can reach 100%. According to the Lambertian luminescence mode, a light extraction efficiency is about 20%, and thus the EQE of the OLED device based on the phosphorescent materials can reach 20%. However, the phosphorescent materials are conventionally complexes of heavy metals, such as Ir, Pt, Os, Re, Ru, etc., and are unsuitable for a large-scale production due to the attendant high production costs. Under a high electric current density, a substantial efficiency fall can be observed in the phosphorescent materials, which lead to a deterioration of the stability of the phosphorescent devices.

Regarding TAA materials, two adjacent triplet excitons are combined to form a singlet excited state molecule with a higher energy level and a ground state molecule. However, since two triplet excitons merely produce one singlet state exciton, the theoretical maximum internal quantum yield can only reach 62.5%. In order to prevent a substantial fall of efficiency, a concentration of triplet excitons should be regulated during this process.

For the TADF materials, when an energy level difference between the singlet excited state and the triplet excited state is relatively small, a reverse intersystem crossing (RISC) may occur among the molecules, and the excitons are converted from T1 state to S1 state by absorbing the ambient heat, so that 75% of triplet excitons and 25% of singlet excitons can be utilized at the same time. In this way, the theoretical maximum internal quantum yield can reach 100%. The TADF materials are mainly organic compounds without rare metal devices, so that the production cost is relatively low. The TADF materials can be chemically modified by various methods. Although the TADF materials have various advantages over the conventional light-emitting materials of OLDEs, there are few TADF materials that have been discovered so far, and it is urgent to develop new TADF materials applicable in OLED devices and display apparatuses.

SUMMARY

In view of the problems associated with conventional materials for a light-emitting layer of an OLED, an object of the present disclosure is to provide a boron heterocyclic compound. The boron heterocyclic compound has a structure represented by chemical formula 1:

chemical formula 1

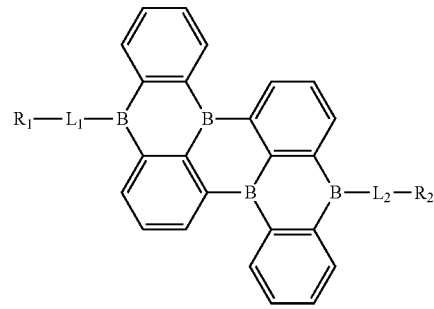

wherein $L_1$ and $L_2$ are each independently selected from the group consisting of C6-C30 aryl, C6-C30 fused aryl, C4-C30 heteroaryl, and C4-C30 fused heteroaryl; and $R_1$ and $R_2$ are each independently selected from the group consisting of C1-C20 alkyl, C3-C20 cycloalkyl, C1-C20 alkoxy, a substituted or unsubstituted phenyl, a substituted or unsubstituted biphenyl, a substituted or unsubstituted naphthyl, a substituted or unsubstituted anthryl, a substituted or unsubstituted phenanthryl, a substituted or unsubstituted acenaphthenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted triphenylenyl, a substituted or unsubstituted benzanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl, a carbazolyl-derived group, acridinyl, an acridinyl-derived group, diarylamino, and a diarylamino-derived group.

The present disclosure further provides a display panel including an organic light-emitting device, the organic light-emitting device includes an anode, a cathode, and a light-emitting layer disposed between the anode and the cathode. A light-emitting host material or a light-emitting guest material of the light-emitting layer is one or more compounds according to the present disclosure.

The present disclosure further provides a display apparatus including the display panel according to the present disclosure.

DESCRIPTION OF EMBODIMENTS

Figure 1:
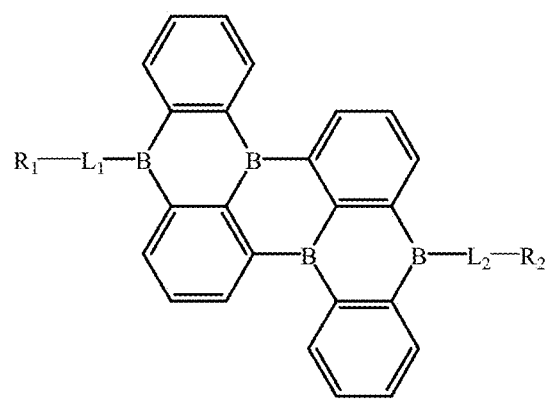
FIG. 1 is a chemical formula of a boron heterocyclic compound according to the present disclosure.

The present disclosure is described in detail in combination with examples and comparative examples. These embodiments are only used to illustrate the present disclosure, but not intended to limit the scope of the present disclosure. Without departing from the scope of the present disclosure, any modification or equivalent replacement with respect to the technical solutions of the present disclosure shall fall into the scope of protection of the present disclosure.

In an aspect, the present disclosure provides a boron heterocyclic compound. In an embodiment, the boron heterocyclic compound has a structure shown as chemical formula 1:

chemical formula 1

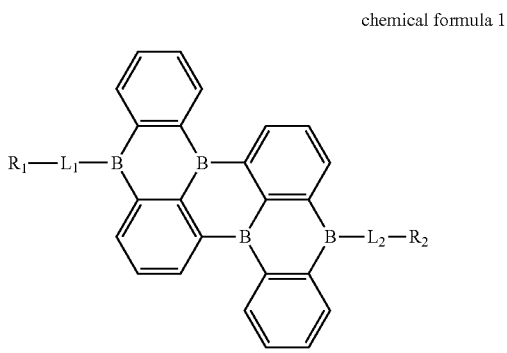

wherein $L_1$ and $L_2$ are each independently selected from the group consisting of C6-C30 aryl, C6-C30 fused aryl, C4-C30 heteroaryl, and C4-C30 fused heteroaryl; and $R_1$ and $R_2$ are each independently selected from the group consisting of C1-C20 alkyl, C3-C20 cycloalkyl, C1-C20 alkoxy, a substituted or unsubstituted phenyl, a substituted or unsubstituted biphenyl, a substituted or unsubstituted naphthyl, a substituted or unsubstituted anthryl, a substituted or unsubstituted phenanthryl, a substituted or unsubstituted acenaphthenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted triphenylenyl, a substituted or unsubstituted benzanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl, a carbazolyl-derived group, acridinyl, an acridinyl-derived group, diarylamino, and a diarylamino-derived group.

In the present disclosure, the boron heterocyclic structure is not only used as an electron acceptor group, but also as a linker. In addition, in the boron heterocyclic compound of the present disclosure, the mother nucleus of the compound molecule has a bridging structure formed by a six-membered boron-containing heterocyclic ring having two boron atoms at para-positions. Such a structure enables the parent nucleus to form a large conjugate system. Moreover, the non-planar structure of the compound molecule of the present disclosure prevents or limits molecule accumulation during the film forming process, making it easier for the compound to form amorphous films to improve device stability.

In the compound of the present disclosure, by attaching a group having a large steric hindrance to the boron atom of the boron heterocyclic compound, intermolecular charge transfer is enhanced, while the molecule accumulation is avoided or reduced, thereby avoiding a π-aggregation or excimers formed by directly overlapping conjugate planes, thereby improving the light-emitting efficiency.

In addition, since the compounds according to the present disclosure have TADF properties, triplet excitons, which are blocked in molecular transition of the conventional fluorescent material, can be used to emit light, thereby improving a light-emitting efficiency of devices including the compounds of the present disclosure. The compounds of the present disclosure have a relatively large rigidity distortion, which reduces an overlap between HOMO and LUMO. In this regard, an energy level difference between the triplet state and the singlet state can be reduced to 0.1 eV to satisfy the requirement of the reverse intersystem crossing from the triplet to single state energy level. In an embodiment, the boron heterocyclic compounds of the present disclosure, having TADF properties, are generally bipolar, and, thus, can greatly improve the injection and transmission of two kinds of carriers when used as a light-emitting layer. In this regard, the compounds of the present disclosure improving the fluorescence quantum efficiency and reduce device operating voltage relative to conventional materials.

According to an embodiment of the compound of the present disclosure, $L_1$ and $L_2$ each independently selected from the group consisting of phenylene, naphthylene, anthrylene, phenanthrylene, pyridylidene, furylene, pyrimidinylidene, benzofurylene, thienylene, benzothienylene, pyrrolylene, indolylidene, carbazolylene, oxazolylene, benzoxazolylene, thiazolylene, benzothiazolylene, imidazolylene, benzoimidazolylene, pyrazolylene, indazolylene, quinolylene, and isoquinolylene.

According to an embodiment of the compound of the present disclosure, $L_1$ and $L_2$ are identical. When $L_1$ and $L_2$ are identical, a synthesis of the compound is much easier, and the electron cloud of the compound can be separated.

According to an embodiment of the compound of the present disclosure, $R_1$ and $R_2$ are identical. When $R_1$ and $R_2$ are identical, one the one hand, it is simpler to synthesize the compound and to obtain a higher purity after purification, which is beneficial to industrialization. On the other hand, with such a symmetric structure, molecules are more likely to be stacked during film formation, thereby increasing charge mobility.

According to an embodiment of the compound of the present disclosure, $R_1$ and $R_2$ are each independently selected from the following formulas:

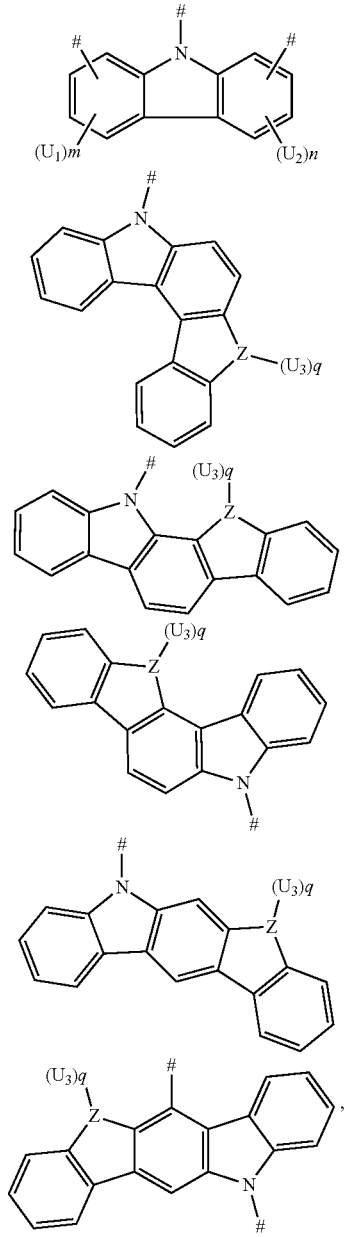

wherein

Z is selected from the group consisting of C, N, O, and S;

q, m, and n are each an integer selected from 0, 1, or 2;

$U_1$, $U_2$ and $U_3$ are each independently selected from the group consisting of a hydrogen atom, C1-C6 alkyl, C1-C6 alkoxy, and C6-C12 aryl;

when Z is O or S, q is 0; and # indicates a bonding position.

According to an embodiment of the compound of the present disclosure, $R_1$ and $R_2$ are each independently selected from the following groups:

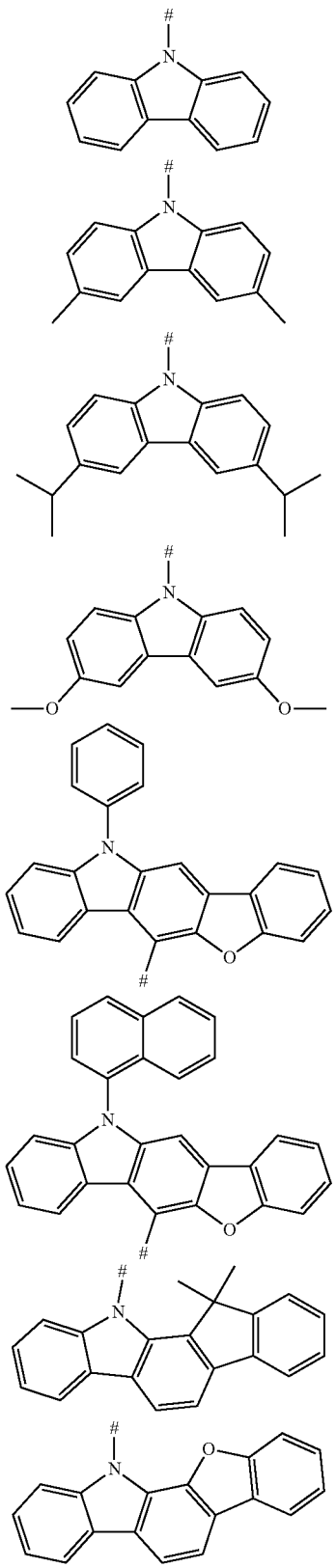

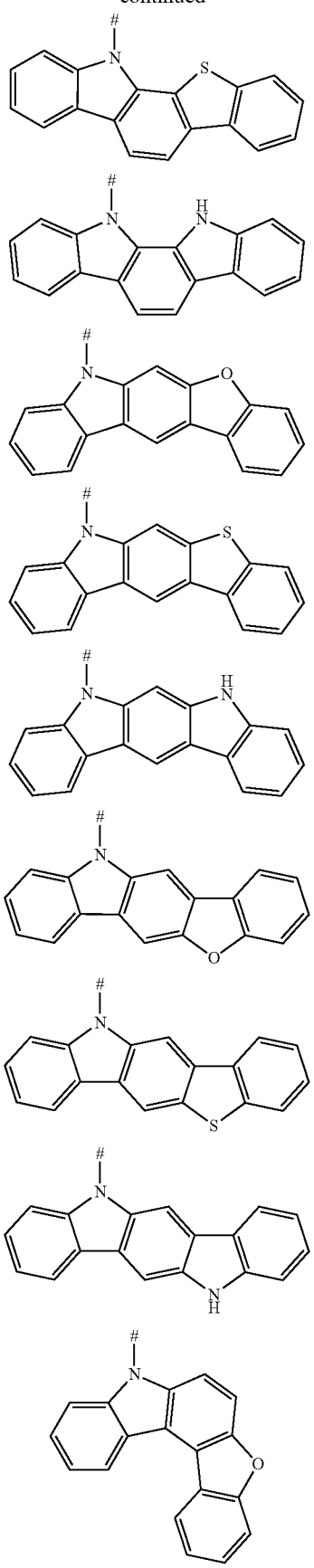
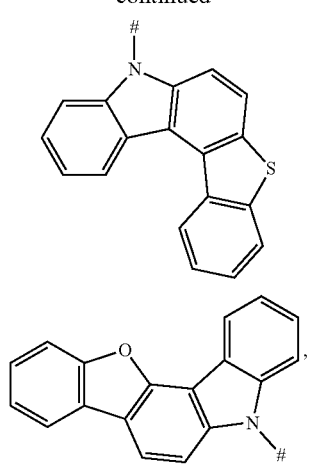
wherein # indicates a bonding position.
Carbazolyl is a weak electron-donating group, which can effectively avoid a red-shift effect of molecular spectrum by distorting the molecular structure.
According to an embodiment of the compound of the present disclosure, $R_1$ and $R_2$ are each independently selected from the following formulas:
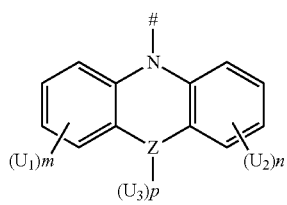
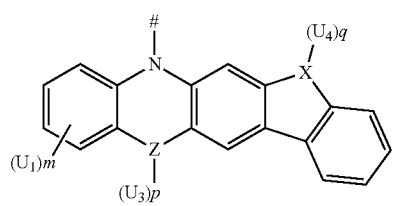
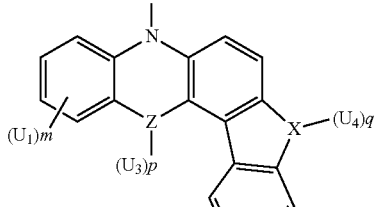
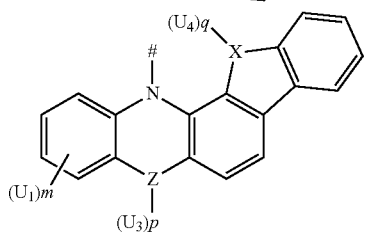

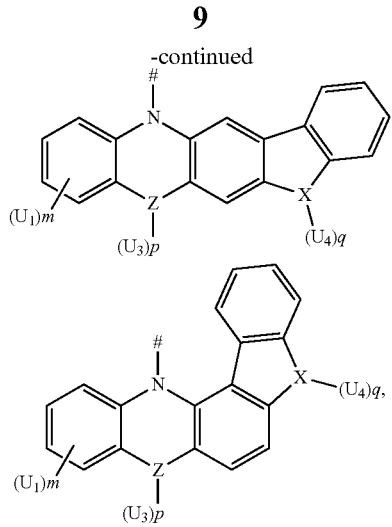

wherein

Z and X are each independently selected from C, N, O, S, and Si;

m, n, p, and q are each an integer independently selected from 0, 1, or 2;

$U_1$, $U_2$, $U_3$, $U_4$ are each independently selected from the group consisting of a hydrogen atom, C1-C6 alkyl, C3-C6 cycloalkyl, C1-C6 alkoxy, C6-C12 aryl, and C12-C20 substituted or unsubstituted diphenylamino;

when Z is O or S, p is 0;

when X is O or S, q is 0; and # indicates a bonding position.

According to an embodiment of the compound of the present disclosure, $R_1$ and $R_2$ are each independently selected from the following formulas:

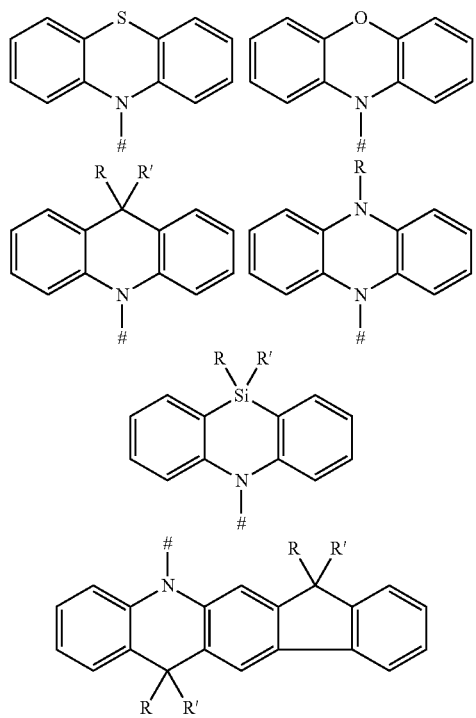

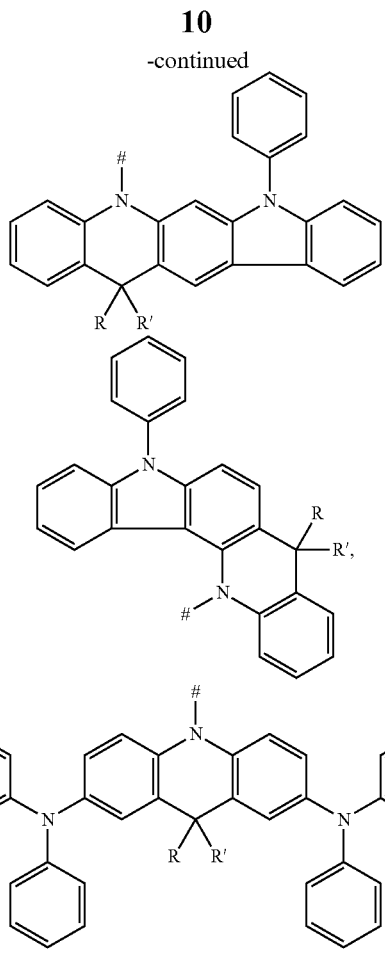

wherein

R and R' are each independently selected from the group consisting of a hydrogen atom, C1-C6 alkyl, C1-C6 alkoxy, C1-C6 cycloalkyl, C6-C12 aryl, and C4-C12 heteroaryl; and # indicates a bonding position.

The acridinyl-like group, such as phenothiazinyl, phenoxazinyl, etc., has good morphological stability. It is favorable for the formation of an amorphous state in terms of the film formation morphology when being introduced into the molecule, thereby improving the stability of an organic layer.

According to an embodiment of the compound of the present disclosure, $R_1$ and $R_2$ are each independently selected from the following formulas:

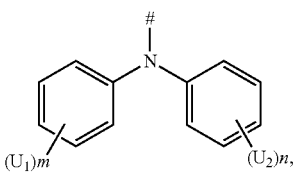

wherein $U_1$ and $U_2$ are each independently selected from the group consisting of a hydrogen atom, C1-C6 alkyl, and C1-C6 alkoxy;

m and n are each an integer independently selected from 0, 1, or 2; and # indicates a bonding position.

According to an embodiment of the compound of the present disclosure, $R_1$ and $R_2$ are each independently selected from the following formulas:

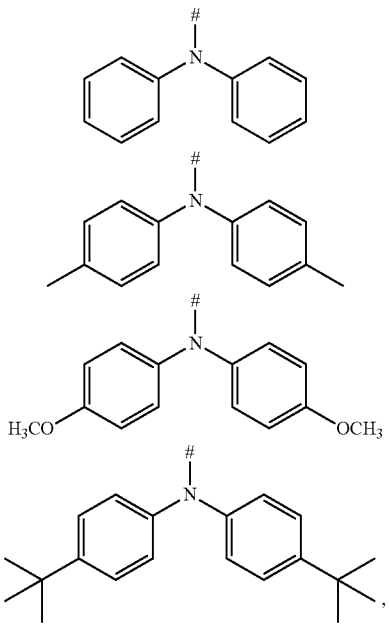

wherein # indicates a bonding position.

Aniline can be seen as a weak rigid carbazolyl group, which has good thermal stability and hole transmission performance. When the aniline is introduced into the molecule, the charge transfer performance can be effectively balanced.

According to an embodiment of the compound of the present disclosure, $R_1$ and $R_2$ are each independently selected from the following formulas:

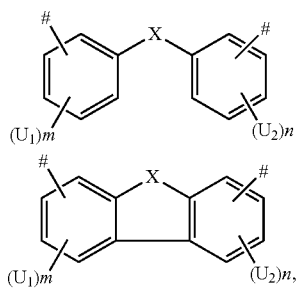

wherein

X is O or S;

m and n are each an integer independently selected from 0, 1, or 2;

$U_1$ and $U_2$ are each independently selected from the group consisting of a hydrogen atom, C1-C6 alkyl, C3-C6 cycloalkyl, and C1-C6 alkoxy; and # indicates a bonding position.

According to an embodiment of the compound of the present disclosure, $R_1$ and $R_2$ are each independently selected from the following formulas:

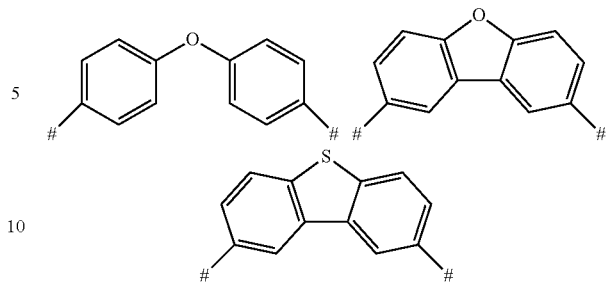

wherein # indicates a bonding position.

Diphenyl ether, similar to aniline, is a weak rigid carbazolyl group with good thermal stability and hole transmission performance. When the diphenyl ether group is introduced into the molecule, charge transfer performance can be effectively balanced. Dibenzothienyl and dibenzofuryl are weak electron-donating groups, and have the conjugation systems with strong outer-ring conjugation, so as to form a strong interaction with the parent nucleus and improve the molecular stability.

According to an embodiment of the compound of the present disclosure, $L_1$ and $L_2$ are each independently selected from the following compounds:

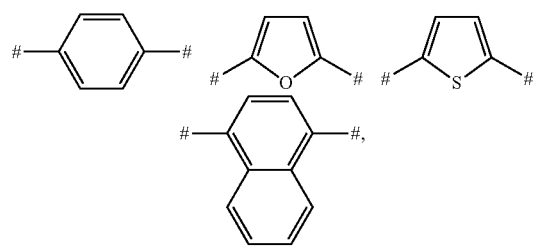

wherein $R_1$ and $R_2$ are each independently selected from the following formulas:

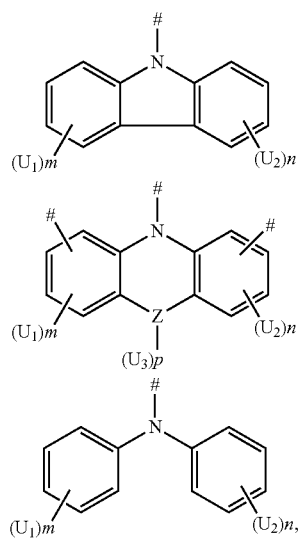

wherein $U_1$, $U_2$ and $U_3$ are each independently selected from the group consisting of C1-C3 alkyl, and C6-C12 aryl;
m and n are 0,
p is an integer selected from 0, 1, and 2;
Z is selected from the group consisting of C, N, O, and S,
when Z is O or S, p or q is 0; and
# indicates a bonding position.

According to an embodiment of the compound of the present disclosure, $L_1$ and $L_2$ are each independently selected from the following groups:

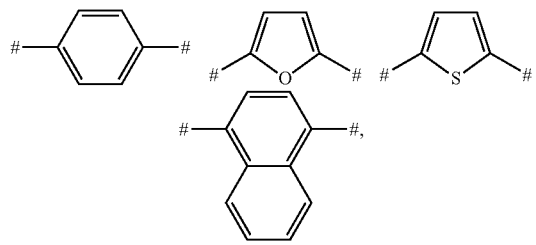

wherein $R_1$ and $R_2$ are each independently selected from the following groups:

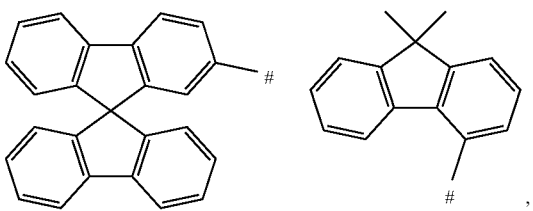

wherein # indicates a bonding position.

Regarding the combinations of the groups in this embodiment, on the one hand, a distorted spatial structure can be formed, and thus the HOMO and LUMO energy levels can be further separated apart, and $\Delta E_{ST}$ is smaller; and on the other hand, these combinations of groups will not result in a complete separation between the HOMO and LUMO energy levels, which may lead to a poor charge transfer performance.

According to an embodiment of the compound of the present disclosure, the compound is one of the following compounds:

M1

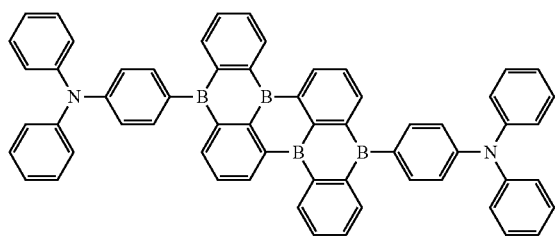

M2

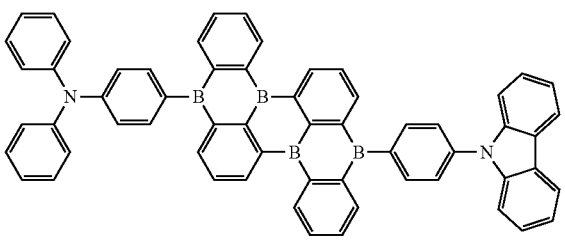

M3

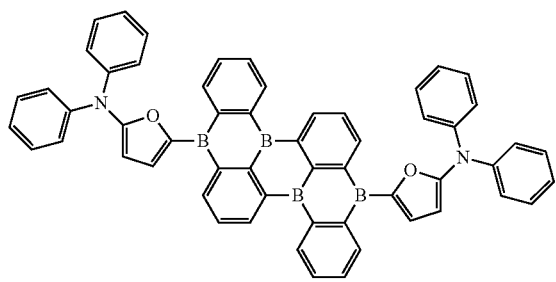

M4

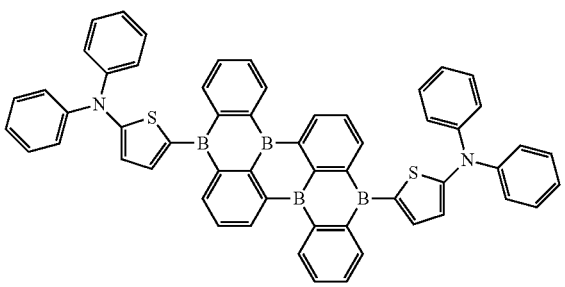

M5

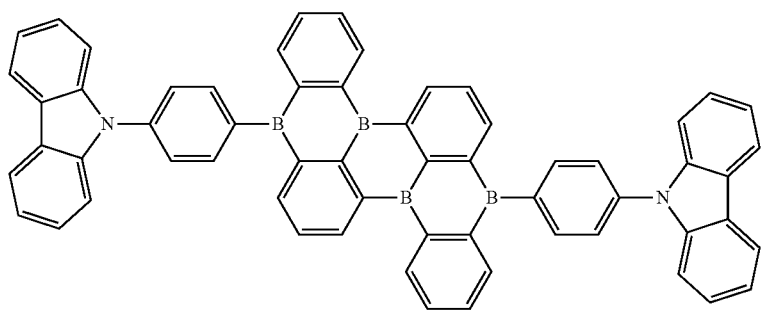

-continued
M6
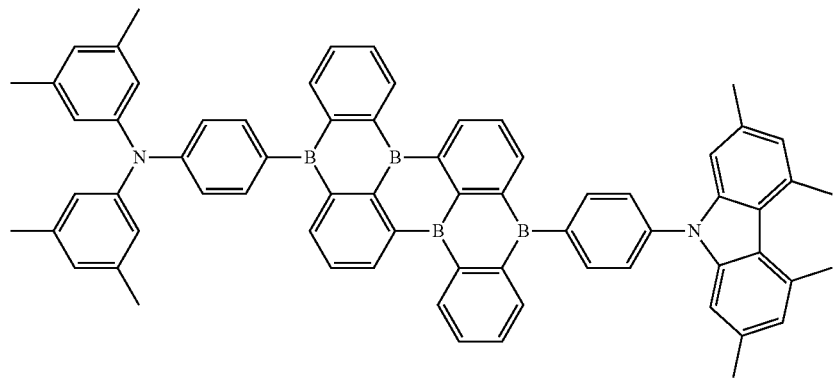
M7
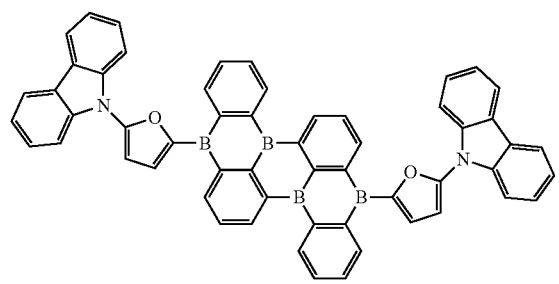
M8
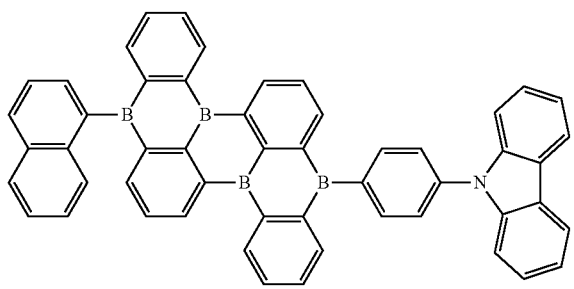
M9
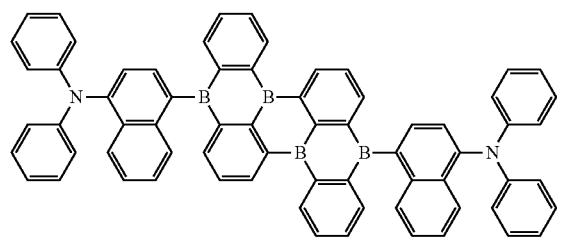
M10
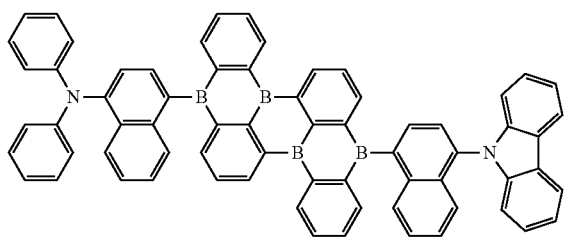
M11
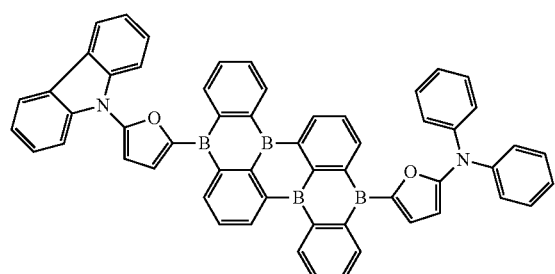
M12
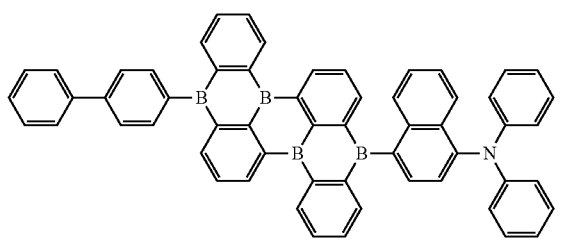
M13
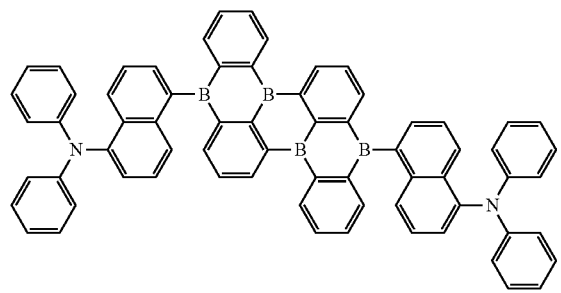
M14
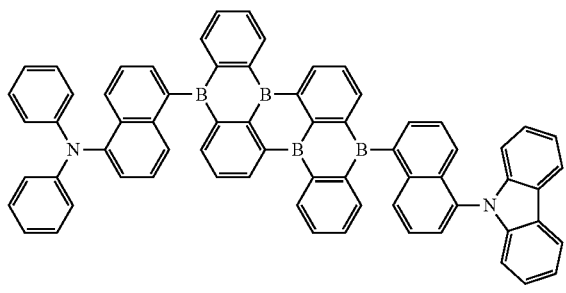

-continued
M15
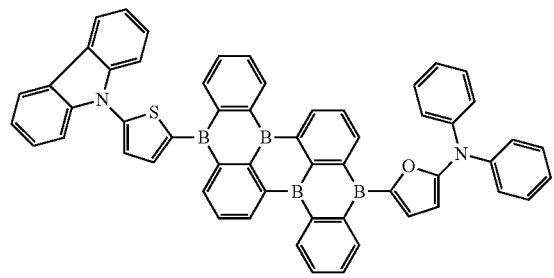
M16
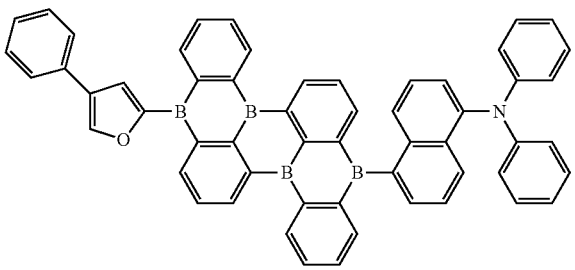
M17
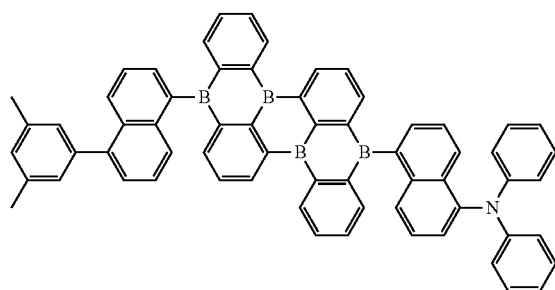
M18
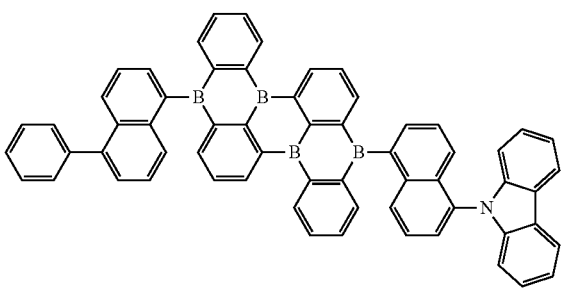
M19
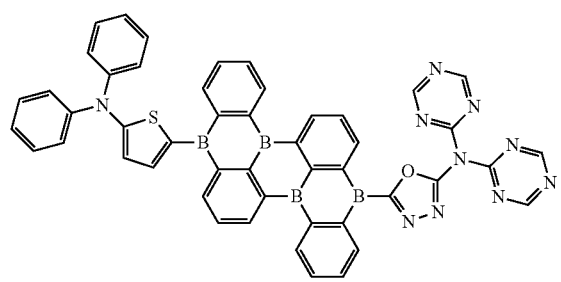
M20
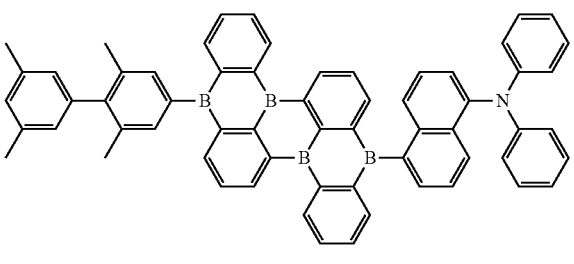
M21
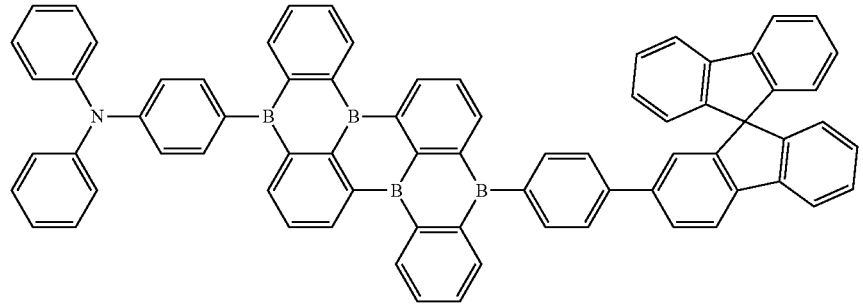
M22
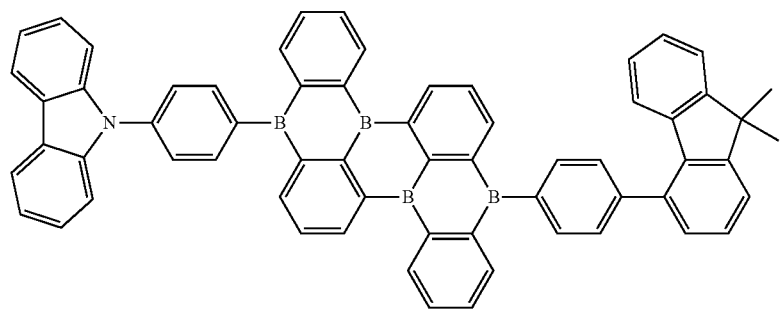

-continued
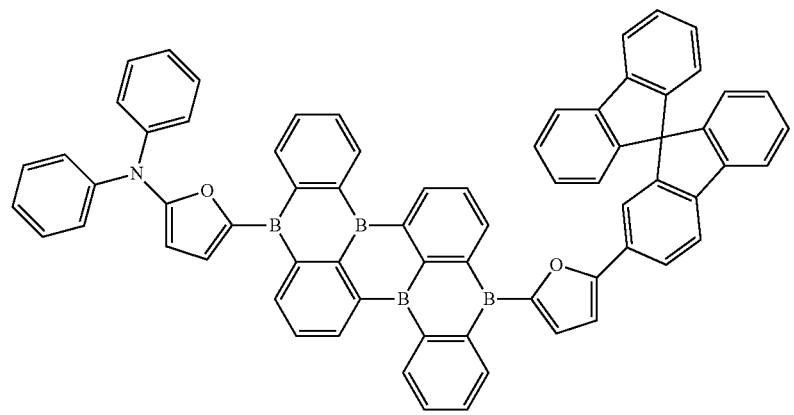
M23
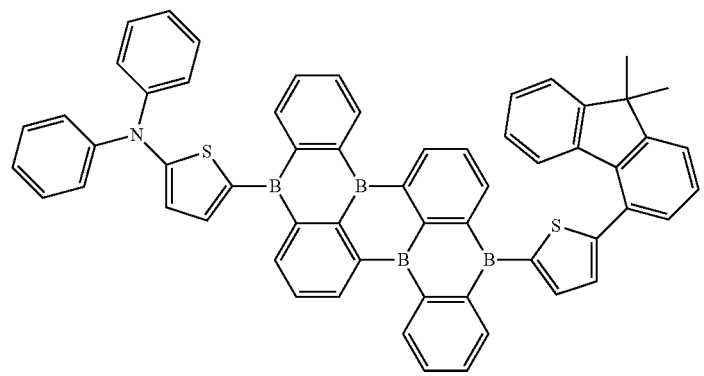
M24
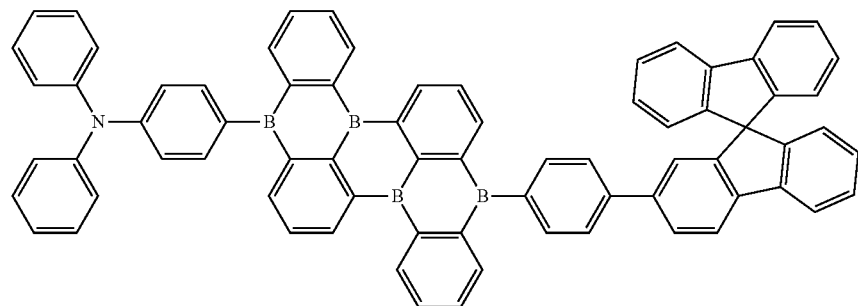
M21
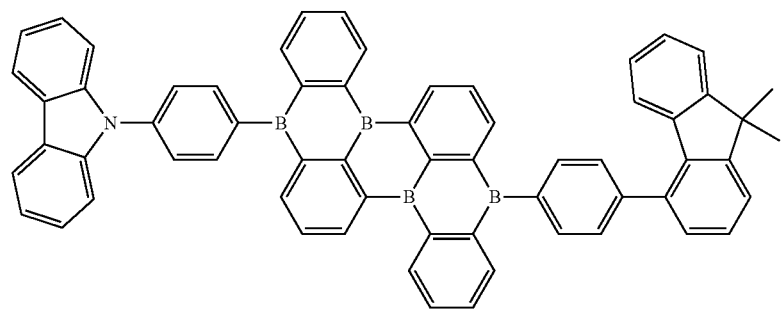
M22

M23

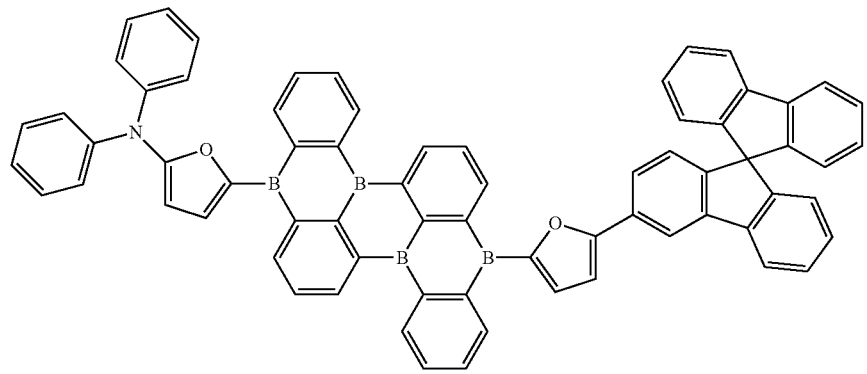

M24

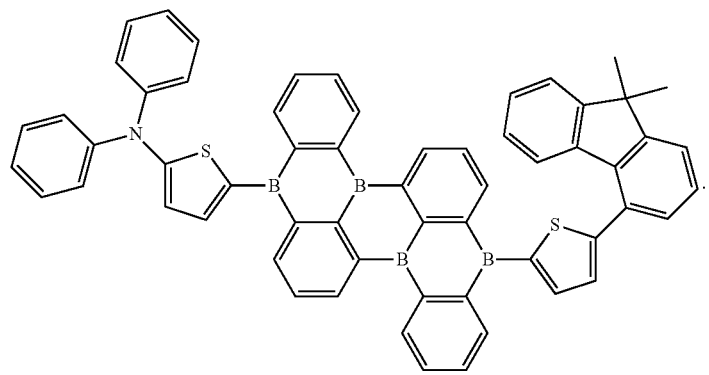

As for the boron heterocyclic compound of the present disclosure, an energy level difference between an energy level, $E_{S1}$, of a lowest singlet level, S1, and an energy level, $E_{T1}$, of a lowest triplet level, T1, of the compound satisfies: $\Delta E_{ST}=E_{S1}-E_{T1}\leq 0.25$ eV. Theoretical calculations of the TADF materials indicate that the compound can only have TADF property when $\Delta E_{ST}$ is lower than 0.25.

The boron heterocyclic compound of the present disclosure has the TADF property and is suitable for use as a host material or a guest material of a light-emitting layer of an OLED.

In another aspect, the present disclosure provides preparation methods of exemplary boron heterocyclic compounds M1, M2, M3 and M4, as described in the following Examples 1 to 4.

M2

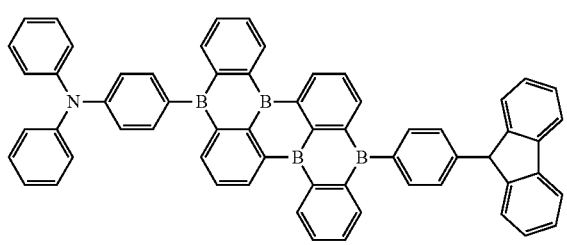

M1

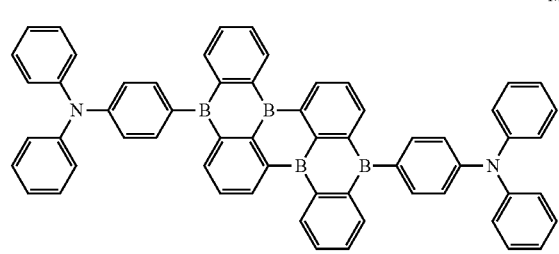

M3

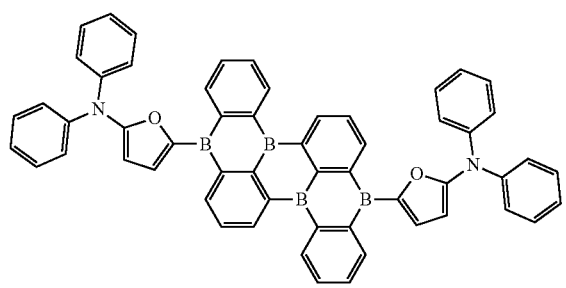

M4

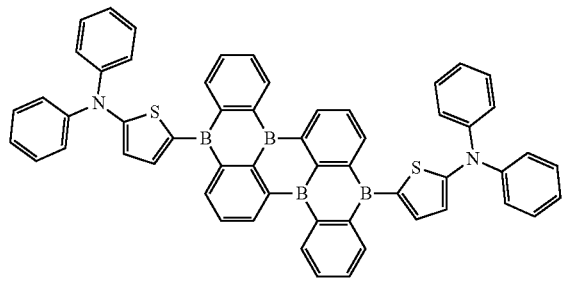

Example 1

Synthesis of compound M1

Synthesis of compound B

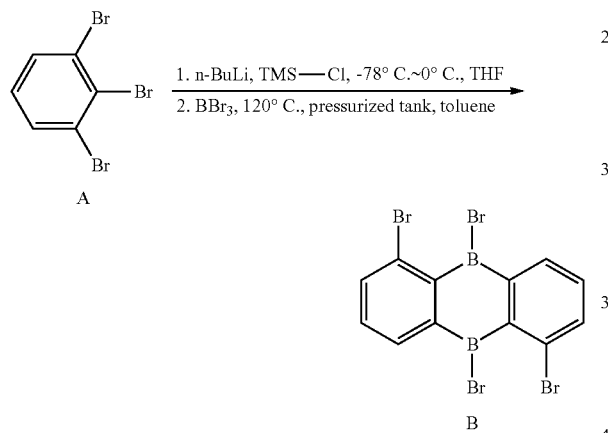

In a 250 ml three-necked flask, 6.30 g (20 mmol) of a substrate A was dissolved in THF (80 mL), and nitrogen displacement was performed three times. The temperature was lowered to −78° C., and then 40 mL (100 mmol) of n-BuLi was slowly added dropwise while maintaining the temperature below −65° C., and the mixture was stirred for 30 min after the dropwise addition was finished. Then, 4.36 g (40 mmol) of TMS-Cl was slowly added dropwise, and the temperature was raised to 0° C., and the reaction continued at room temperature for 4 h. Then, the reaction was quenched with ice water. DCM (80 mL*2) was added for extraction. The organic phase was collected and rotary evaporated to obtain an oil product, and the oil product was then crystallized with toluene/ethanol to obtain a solid. In a 200 mL pressurized tank, 6.03 g (20 mmol) of the solid, anhydrous toluene solution (70 mL) and 2.5 g (10 mmol) of boron tribromide were added sequentially, and the mixture was stirred for 12 h at 120° C. The reaction was then quenched with H$_2$O (100 mL). The reaction solution was extracted with dichloromethane (DCM) (100 mL*3), then the organic phase was collected, dried, filtered, rotary evaporated to remove the solvent, and crystallized with dichloromethane/ethanol to obtain a solid F.

MALDI-TOF: 491.73

$^1$H NMR (500 MHz, CDCl$_3$): δ 7.69 (s, 2H), 7.65 (s, 2H), 7.21 (s, 2H).

$^{13}$C NMR (125 MHz, CDCl$_3$): δ 141.29 (s), 132.32 (s), 131.10 (s), 129.79 (s), 129.28 (s).

Synthesis of Compound C

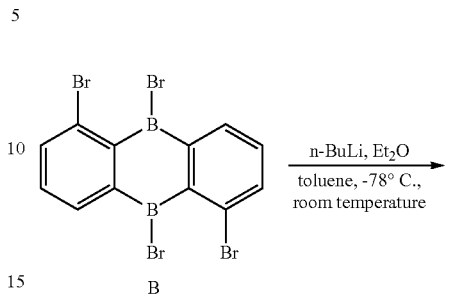

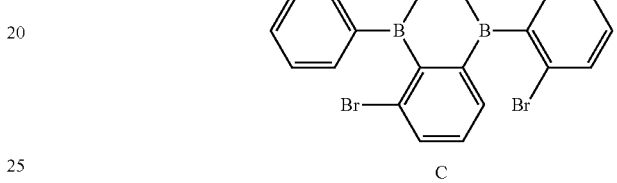

9.83 g (20 mmol) of compound B was added to a reaction flask, added with ether (150 mL) to dissolve, and nitrogen displacement was performed three times. The temperature was lowered to −78° C., and then 16.08 mL (2.5M, 40 mmol) n-BuLi was slowly added while the temperature is controlled to be not greater than −65° C., and stirred for 30 min after the addition is finished. Then, 9.44 g (40 mmol) o-dibromobenzene was dissolved in 60 mL toluene, and was then slowly added dropwise to the reaction solution. After the completion of the dropwise addition, the reaction solution was naturally warmed room temperature, and the reaction continued at room temperature for 6 h. After the reaction was quenched by adding ice water (100 mL), the mixture was extracted with 80 mL of DCM twice, and then with saturated brine once. The organic phase was collected and rotary evaporated, and the product was purified by column chromatography (mobile phase: n-hexane:dichloromethane=3:1) to obtain the compound C.

MALDI-TOF: 643.80

$^1$H NMR (500 MHz, CDCl$_3$): δ 7.70 (t, J=4.5 Hz, 2H), 7.65 (s, 4H), 7.64 (s, 2H), 7.26 (s, 2H), 7.20 (d, J=10.0 Hz, 4H).

$^{13}$C NMR (125 MHz, CDCl$_3$): δ 135.33 (s), 134.56 (s), 134.32 (s), 133.26 (s), 132.95 (s), 129.15 (s), 128.29 (d, J=0.9 Hz), 125.70 (s), 121.87 (s), 92.88 (s).

Synthesis of Compound D

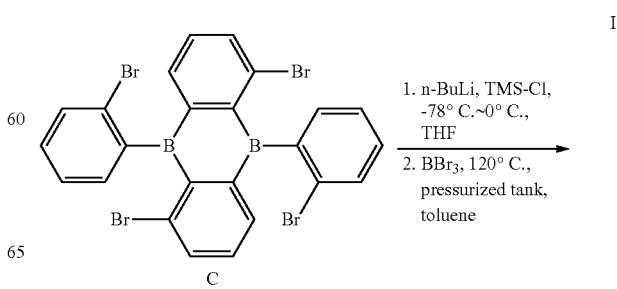

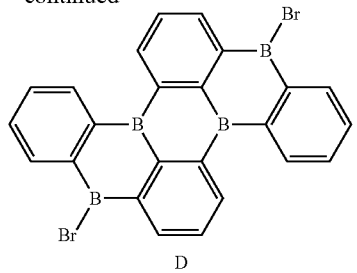

n a 250 ml three-necked flask, 12.87 g (20 mmol) of a substrate C was dissolved with THF (80 mL), and nitrogen displacement was performed three times. The temperature was lowered to −78° C., and then 40 mL (100 mmol) of n-BuLi was slowly added dropwise while the temperature was controlled below −65° C., and the mixture was stirred for 30 min after the dropwise addition was finished. Then, 8.71 g (80 mmol) of TMS-Cl was slowly added dropwise, and the temperature was raised to 0° C., and the reaction continued at room temperature for 4 h. Then, the reaction was quenched with ice water. DCM (80 mL*2) was added for extraction. The organic phase was collected and rotary evaporated to obtain an oil product, and the oil product was then crystallized with toluene/ethanol to obtain a solid. In a 200 mL pressurized tank, 12.34 g (20 mmol) of the solid, anhydrous toluene solution (70 mL) and 2.5 g (10 mmol) of boron tribromide were added sequentially, and stirred for 12 h at 120° C. The reaction was then quenched with H$_2$O (100 mL). The reaction solution was extracted with dichloromethane (DCM) (100 mL*3), and the organic phase was collected, dried, filtered, rotary evaporated to remove the solvent, and crystallized with dichloromethane/ethanol to obtain a solid D.

MALDI-TOF: 504.99

$^1$H NMR (500 MHz, CDCl$_3$): δ 7.75 (s, 8H), 7.32 (s, 6H).

$^{13}$C NMR (125 MHz, CDCl$_3$): δ 136.12 (s), 134.66 (s), 134.19 (s), 133.29 (s), 127.18 (s), 125.83 (s), 123.78 (s), 116.83 (s), 111.44 (s), 106.98 (s), 96.11 (s).

Synthesis of Compound M1

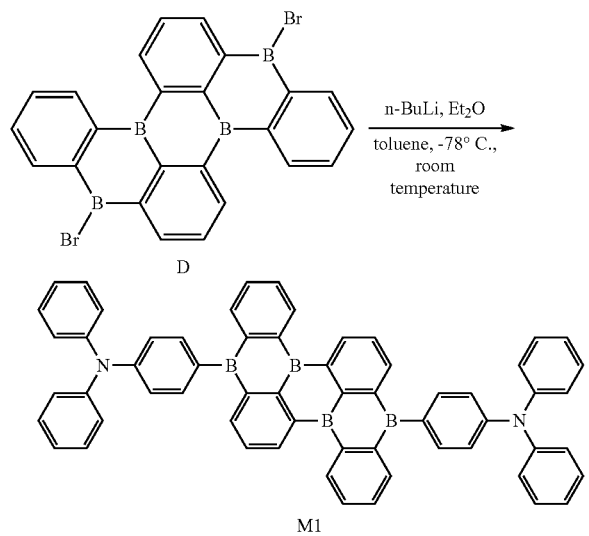

10.11 g (20 mmol) of compound D was added to a reaction flask and dissolved in ether (150 mL), and nitrogen displacement was performed three times. The temperature was lowered to −78° C., and then 16.08 mL (2.5M, 40 mmol) of n-BuLi was slowly added dropwise while the temperature was controlled below −65° C., and the mixture was stirred for 30 min after the addition was finished. Then, 12.97 g (40 mmol) of (4-bromo-phenyl)-diphenylamine was dissolved in 60 mL toluene, and was then slowly added dropwise to the reaction solution. After the completion of the dropwise addition, the reaction solution was naturally warmed to room temperature, and the reaction continued at room temperature for 6 h. After the reaction was quenched by adding ice water (100 mL), the mixture was extracted with 80 mL of DCM twice, and then with saturated brine once. The organic phase was collected and rotary evaporated, and the product was purified by column chromatography (mobile phase: n-hexane:dichloromethane=3:1) to obtain the compound M1.

MALDI-TOF: 833.38

$^1$H NMR (500 MHz, CDCl$_3$): δ 7.75 (s, 8H), 7.71 (s, 4H), 7.32 (s, 4H), 7.31-7.25 (m, 4H), 7.24 (s, 4H), 7.18 (s, 8H), 7.08 (s, 8H), 7.00 (s, 4H).

$^{13}$C NMR (125 MHz, CDCl$_3$): δ 151.71 (s), 146.93 (s), 136.00 (d, J=10.1 Hz), 135.47 (s), 134.93 (s), 134.01 (s), 130.24 (s), 129.27 (s), 128.36 (s), 127.44 (s), 127.11 (s), 124.67 (s), 124.19 (s), 122.99 (s), 102.22 (s), 96.11 (s), 95.62 (s), 91.98 (s).

Example 2

Synthesis of Compound M2

Synthesis of Compound B

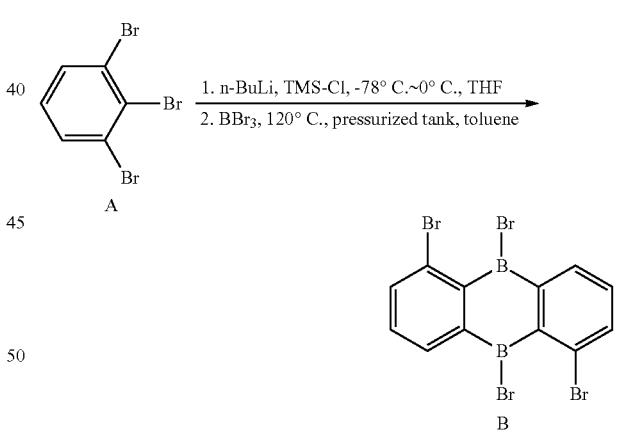

In a 250 ml three-necked flask, 6.30 g (20 mmol) of a substrate A was dissolved with THF (80 mL), and nitrogen displacement was performed three times. The temperature was lowered to −78° C., and then 40 mL (100 mmol) of n-BuLi was slowly added dropwise while the temperature was controlled below −65° C., and the mixture was stirred for 30 min after the dropwise addition was finished. Then, 4.36 g (40 mmol) of TMS-Cl was slowly added dropwise, and the temperature was raised to 0° C., and the reaction continued at room temperature for 4 h. Then, the reaction was quenched with ice water. DCM (80 mL*2) was added for extraction. The organic phase was collected and rotary evaporated to obtain an oil product, and the oil product was then crystallized with toluene/ethanol to obtain a solid. In a 200 mL pressurized tank, 6.03 g (20 mmol) of the solid, anhydrous toluene solution (70 mL) and 2.5 g (10 mmol) of boron tribromide were added sequentially, and the mixture was stirred for 12 h at 120° C. The reaction was then quenched with H₂O (100 mL). The reaction solution was extracted with dichloromethane (DCM) (100 mL*3), and the organic phase was collected, dried, filtered, rotary evaporated to remove the solvent, and crystallized with dichloromethane/ethanol to obtain a solid F.

MALDI-TOF: 491.73

$^1$H NMR (500 MHz, CDCl$_3$): δ 7.69 (s, 2H), 7.65 (s, 2H), 7.21 (s, 2H).

$^{13}$C NMR (125 MHz, CDCl$_3$): δ 141.29 (s), 132.32 (s), 131.10 (s), 129.79 (s), 129.28 (s).

Synthesis of Compound C

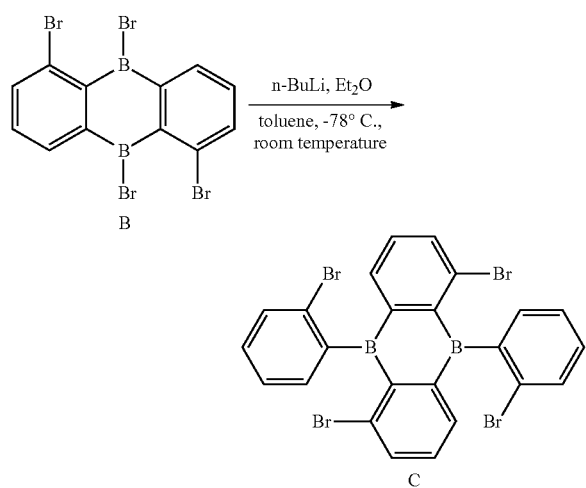

9.83 g (20 mmol) of compound B was added to a reaction flask, added with ether (150 mL) to dissolve, and nitrogen displacement was performed three times. The temperature was lowered to −78° C., and then 16.08 mL (2.5M, 40 mmol) of n-BuLi was slowly added dropwise while the temperature was controlled below −65° C., and stirred for 30 min after the addition was finished. Then, 9.44 g (40 mmol) of o-dibromobenzene was dissolved in 60 mL toluene, and was then slowly added dropwise to the reaction solution. After the completion of the dropwise addition, the reaction solution was naturally warmed room temperature, and the reaction continued at room temperature for 6 h. After the reaction finished, ice water (100 mL) was added to quench the reaction. Then, the mixture was extracted with 80 mL of DCM twice, and with saturated brine once. The organic phase was collected and rotary evaporated, and the product was purified by column chromatography (mobile phase: n-hexane:dichloromethane=3:1) to obtain compound C.

MALDI-TOF: 643.80

$^1$H NMR (500 MHz, CDCl$_3$): δ 7.70 (t, J=4.5 Hz, 2H), 7.65 (s, 4H), 7.64 (s, 2H), 7.26 (s, 2H), 7.20 (d, J=10.0 Hz, 4H).

$^{13}$C NMR (125 MHz, CDCl$_3$): δ 135.33 (s), 134.56 (s), 134.32 (s), 133.26 (s), 132.95 (s), 129.15 (s), 128.29 (d, J=0.9 Hz), 125.70 (s), 121.87 (s), 92.88 (s).

Synthesis of Compound D

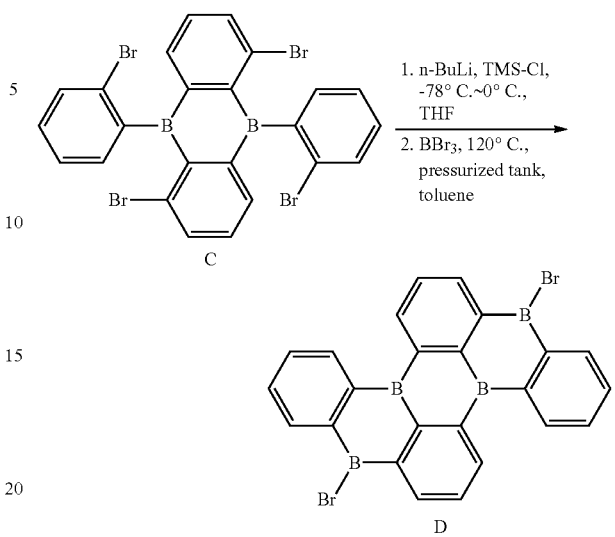

In a 250 ml three-necked flask, 12.87 g (20 mmol) of a substrate C was dissolved with THF (80 mL), and nitrogen displacement was performed three times. The temperature was lowered to −78° C., and then 40 mL (100 mmol) of n-BuLi was slowly added dropwise while the temperature was controlled below −65° C., and the mixture was stirred for 30 min after the dropwise addition was finished. Then, 8.71 g (80 mmol) of TMS-Cl was slowly added dropwise, and the temperature was raised to 0° C., and the reaction continued at room temperature for 4 h. Then, the reaction was quenched with ice water, and DCM (80 mL*2) was added for extraction. The organic phase was collected and rotary evaporated to obtain an oil product, and the oil product was then crystallized with toluene/ethanol to obtain a solid. In a 200 mL pressurized tank, 12.34 g (20 mmol) of the solid, anhydrous toluene solution (70 mL) and 2.5 g (10 mmol) of boron tribromide were added sequentially, and the mixture was stirred for 12 h at 120° C. The reaction was then quenched with H₂O (100 mL). The reaction solution was extracted with dichloromethane (DCM) (100 mL*3), and the organic phase was collected, dried, filtered, rotary evaporated to remove the solvent, and crystallized with dichloromethane/ethanol to obtain a solid D.

MALDI-TOF: 504.99

$^1$H NMR (500 MHz, CDCl$_3$): δ 7.75 (s, 8H), 7.32 (s, 6H).

$^{13}$C NMR (125 MHz, CDCl$_3$): δ 136.12 (s), 134.66 (s), 134.19 (s), 133.29 (s), 127.18 (s), 125.83 (s), 123.78 (s), 116.83 (s), 111.44 (s), 106.98 (s), 96.11 (s).

Synthesis of Compound M2

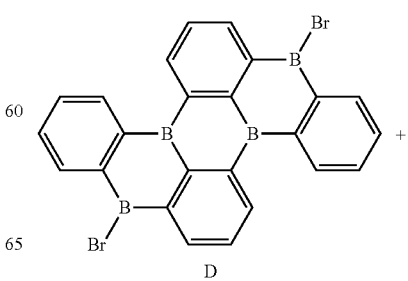

-continued

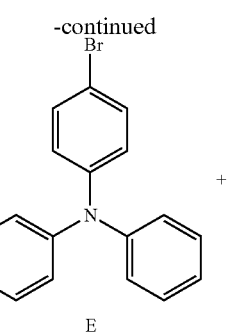

E

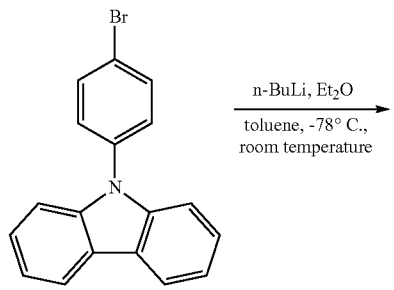

F

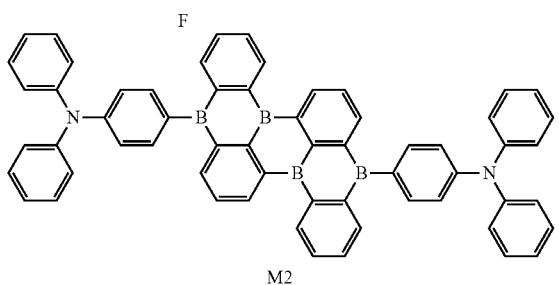

M2

10.11 g (20 mmol) of the compound D was added to a reaction flask, added with ether (150 mL) to dissolve, and nitrogen displacement was performed three times. The temperature was lowered to −78° C., and then 16.08 mL (2.5M, 40 mmol) of n-BuLi was slowly added dropwise while the temperature was controlled below −65° C., and stirred for 30 min after the addition was finished. Then, 6.48 g (20 mmol) of a monomer E and 6.44 g (20 mmol) of a monomer F were dissolved in 60 mL toluene, and then slowly added dropwise to the reaction solution. After the completion of the dropwise addition, the reaction solution was naturally warmed room temperature, and the reaction continued at room temperature for 6 h. After the reaction was quenched by adding ice water (100 mL), the mixture was extracted with 80 mL of DCM twice, and then with saturated brine once. The organic phase was collected and rotary evaporated, and the product was purified by column chromatography (mobile phase: n-hexane:dichloromethane=3:1) to obtain the compound M2.

MALDI-TOF: 832.36

$^1$H NMR (500 MHz, CDCl$_3$): δ 8.55 (s, 1H), 8.19 (s, 1H), 7.89 (s, 2H), 7.82-7.64 (m, 10H), 7.52 (s, 1H), 7.40 (s, 1H), 7.32 (s, 5H), 7.31-7.26 (m, 2H), 7.24 (s, 2H), 7.22-7.15 (m, 6H), 7.13 (dd, J=5.0, 2.8 Hz, 1H), 7.11 (s, 3H), 7.08 (s, 2H), 7.03 (dd, J=3.5, 2.9 Hz, 1H), 7.00 (s, 1H), 6.96 (t, J=3.3 Hz, 1H).

$^{13}$C NMR (125 MHz, CDCl$_3$): δ 151.71 (s), 149.09 (s), 146.93 (s), 136.00 (d, J=8.1 Hz), 135.42 (d, J=8.7 Hz), 134.87 (d, J=10.5 Hz), 134.01 (s), 130.24 (s), 129.27 (s), 128.36 (s), 127.72 (s), 127.44 (s), 127.11 (s), 125.67 (s), 124.67 (s), 124.19 (s), 122.99 (s), 121.91 (s), 121.15 (d, J=2.7 Hz), 114.95 (s), 102.22 (s), 96.11 (s), 95.62 (s), 91.98 (s).

Example 3

Synthesis of Compound M3

Synthesis of Compound B

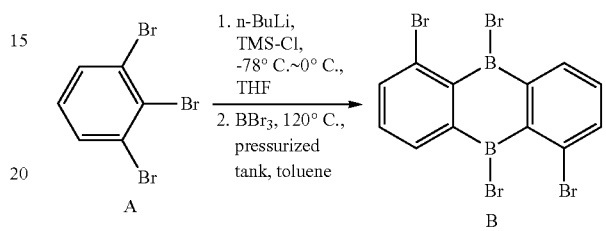

In a 250 ml three-necked flask, 6.30 g (20 mmol) of a substrate A was dissolved with THF (80 mL), and nitrogen displacement was performed three times. The temperature was lowered to −78° C., and then 40 mL (100 mmol) of n-BuLi was slowly added dropwise while the temperature was controlled below −65° C., and the mixture was stirred for 30 min after the dropwise addition was finished. Then, 4.36 g (40 mmol) of TMS-Cl was slowly added dropwise, and the temperature was raised to 0° C., and the reaction continued at room temperature for 4 h. Then, the reaction was quenched with ice water, and DCM (80 mL*2) was added for extraction. The organic phase was collected and rotary evaporated to obtain an oil product, and the oil product was then crystallized with toluene/ethanol to obtain a solid. In a 200 mL pressurized tank, 6.03 g (20 mmol) of the solid, anhydrous toluene solution (70 mL) and 2.5 g (10 mmol) of boron tribromide were added sequentially, and stirred for 12 h at 120° C. The reaction was then quenched with H$_2$O (100 mL). The reaction solution was extracted with dichloromethane (DCM) (100 mL*3), and the organic phase was collected, dried, filtered, rotary evaporated to remove the solvent, and crystallized with dichloromethane/ethanol to obtain a solid F.

MALDI-TOF: 491.73

$^1$H NMR (500 MHz, CDCl$_3$): δ 7.69 (s, 2H), 7.65 (s, 2H), 7.21 (s, 2H).

$^{13}$C NMR (125 MHz, CDCl$_3$): δ 141.29 (s), 132.32 (s), 131.10 (s), 129.79 (s), 129.28 (s).

Synthesis of Compound C

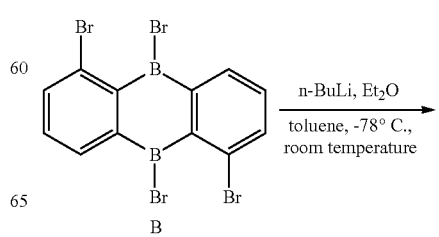

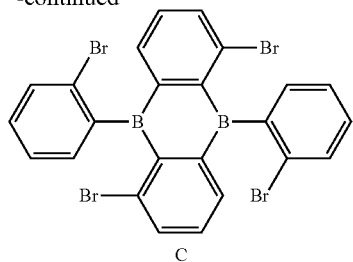

C 9.83 g (20 mmol) of the compound B was added to a reaction flask, added with ether (150 mL) to dissolve, and nitrogen displacement was performed three times. The temperature was lowered to −78° C., and then 16.08 mL (2.5M, 40 mmol) of n-BuLi was slowly added dropwise while the temperature was controlled below −65° C., and stirred for 30 min after the addition was finished. Then, 9.44 g (40 mmol) of o-dibromobenzene was dissolved in 60 mL toluene, and then slowly added dropwise to the reaction solution. After the completion of the dropwise addition, the reaction solution was naturally warmed room temperature, and the reaction continued at room temperature for 6 h. After the reaction was quenched by adding ice water (100 mL), the mixture was extracted with 80 mL of DCM twice, and then with saturated brine once. The organic phase was collected and rotary evaporated, and the product was purified by column chromatography (mobile phase: n-hexane:dichloromethane=3:1) to obtain the compound C.

MALDI-TOF: 643.80

$^1$H NMR (500 MHz, CDCl$_3$): δ 7.70 (t, J=4.5 Hz, 2H), 7.65 (s, 4H), 7.64 (s, 2H), 7.26 (s, 2H), 7.20 (d, J=10.0 Hz, 4H).

$^{13}$C NMR (125 MHz, CDCl$_3$): δ 135.33 (s), 134.56 (s), 134.32 (s), 133.26 (s), 132.95 (s), 129.15 (s), 128.29 (d, J=0.9 Hz), 125.70 (s), 121.87 (s), 92.88 (s).

Synthesis of Compound D

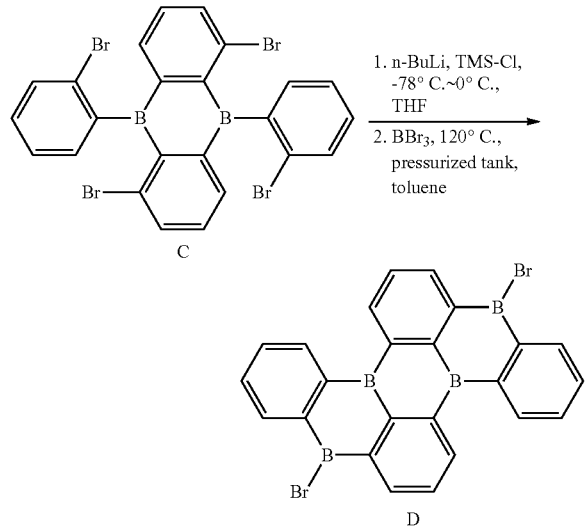

In a 250 ml three-necked flask, 12.87 g (20 mmol) of a substrate C was dissolved with THF (80 mL), and nitrogen displacement was performed three times. The temperature was lowered to −78° C., and then 40 mL (100 mmol) of n-BuLi was slowly added dropwise while the temperature was controlled below −65° C., and the mixture was stirred for 30 min after the dropwise addition was finished. Then, 8.71 g (80 mmol) of TMS-Cl was slowly added dropwise, and the temperature was raised to 0° C., and the reaction continued at room temperature for 4 h. Then, the reaction was quenched with ice water, and DCM (80 mL*2) was added for extraction. The organic phase was collected and rotary evaporated to obtain an oil product, and the oil product was then crystallized with toluene/ethanol to obtain a solid. In a 200 mL pressurized tank, 12.34 g (20 mmol) of the solid, anhydrous toluene solution (70 mL) and 2.5 g (10 mmol) of boron tribromide were added sequentially, and stirred for 12 h at 120° C. The reaction was then quenched with H$_2$O (100 mL). The reaction solution was extracted with dichloromethane (DCM) (100 mL*3), and the organic phase was collected, dried, filtered, rotary evaporated to remove the solvent, and crystallized with dichloromethane/ethanol to obtain a solid D.

MALDI-TOF: 504.99

$^1$H NMR (500 MHz, CDCl$_3$): δ 7.75 (s, 8H), 7.32 (s, 6H).

$^{13}$C NMR (125 MHz, CDCl$_3$): δ 136.12 (s), 134.66 (s), 134.19 (s), 133.29 (s), 127.18 (s), 125.83 (s), 123.78 (s), 116.83 (s), 111.44 (s), 106.98 (s), 96.11 (s).

Synthesis of Compound M3

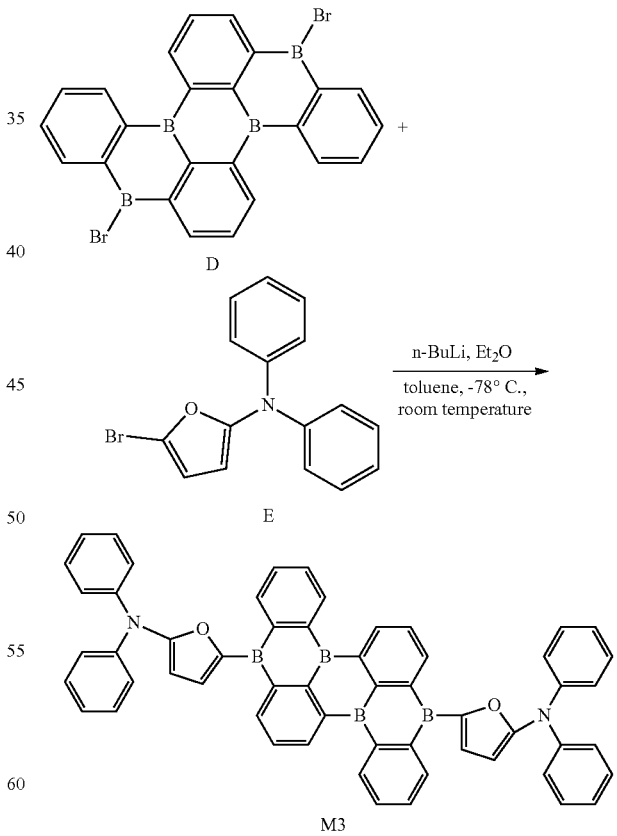

10.11 g (20 mmol) of the compound D was added to a reaction flask, added with ether (150 mL) to dissolve, and nitrogen displacement was performed three times. The temperature was lowered to −78° C., and then 16.08 mL (2.5M, 40 mmol) of n-BuLi was slowly added dropwise while the temperature was controlled below −65° C., and stirred for 30 min after the addition was finished. Then, 12.56 g (40 mmol) of a monomer E was dissolved in 60 mL toluene, and then slowly added dropwise to the reaction solution. After the completion of the dropwise addition, the reaction solution was naturally warmed room temperature, and the reaction continued at room temperature for 6 h. After the reaction was quenched by adding ice water (100 mL), the mixture was extracted with 80 mL of DCM twice, and then with saturated brine once. The organic phase was collected and rotary evaporated, and the product was purified by column chromatography (mobile phase: n-hexane:dichloromethane=3:1) to obtain the compound M3.

MALDI-TOF: 814.33

$^1$H NMR (500 MHz, CDCl$_3$): δ 7.75 (s, 8H), 7.32 (s, 6H), 7.24 (s, 4H), 7.08 (s, 8H), 7.06 (t, J=2.6 Hz, 8H), 7.00 (s, 4H).

$^{13}$C NMR (125 MHz, CDCl$_3$): δ 148.16 (s), 140.90 (s), 140.39 (d, J=10.9 Hz), 135.05 (s), 133.97 (s), 132.06 (s), 130.20 (s), 129.38 (s), 128.56 (s), 127.16 (s), 126.38 (s), 125.62 (s), 122.43 (s), 121.28 (s), 105.91 (s), 101.39 (s), 96.11 (s).

Example 4

Synthesis of Compound M4

Synthesis of Compound B

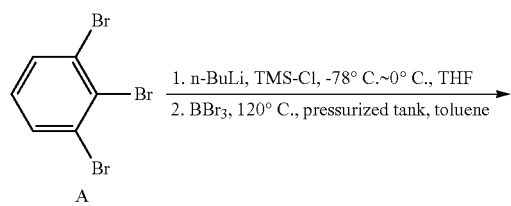

A

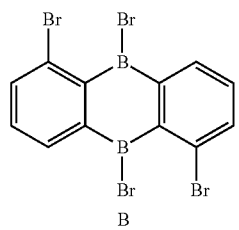

B

In a 250 ml three-necked flask, 6.30 g (20 mmol) of a substrate A was dissolved with THF (80 mL), and nitrogen displacement was performed three times. The temperature was lowered to −78° C., and then 40 mL (100 mmol) of n-BuLi was slowly added dropwise while the temperature was controlled below −65° C., and the mixture was stirred for 30 min after the dropwise addition was finished. Then, 4.36 g (40 mmol) of TMS-Cl was slowly added dropwise, and the temperature was raised to 0° C., and the reaction continued at room temperature for 4 h. Then, the reaction was quenched with ice water, and DCM (80 mL*2) was added for extraction. The organic phase was collected and rotary evaporated to obtain an oil product, and the oil product was then crystallized with toluene/ethanol to obtain a solid. In a 200 mL pressurized tank, 6.03 g (20 mmol) of the solid, anhydrous toluene solution (70 mL) and 2.5 g (10 mmol) of boron tribromide were added sequentially, and stirred for 12 h at 120° C. The reaction was then quenched with H$_2$O (100 mL). The reaction solution was extracted with dichloromethane (DCM) (100 mL*3), and the organic phase was collected, dried, filtered, rotary evaporated to remove the solvent, and crystallized with dichloromethane/ethanol to obtain a solid F.

MALDI-TOF: 491.73

$^1$H NMR (500 MHz, CDCl$_3$): δ 7.69 (s, 2H), 7.65 (s, 2H), 7.21 (s, 2H).

$^{13}$C NMR (125 MHz, CDCl$_3$): δ 141.29 (s), 132.32 (s), 131.10 (s), 129.79 (s), 129.28 (s).

Synthesis of Compound C

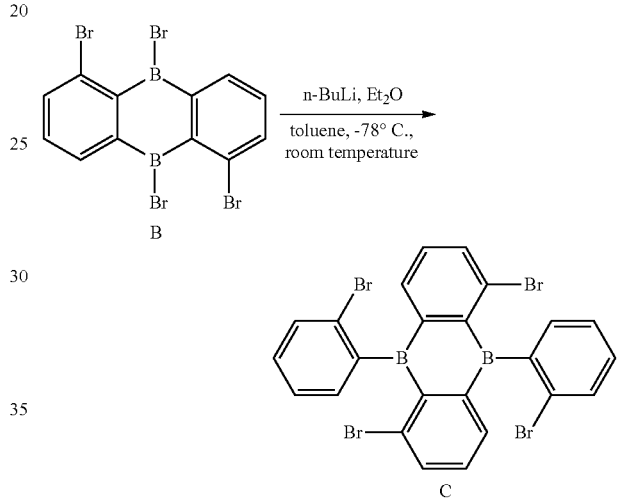

9.83 g (20 mmol) of the compound B was added to a reaction flask and dissolved in ether (150 mL), and nitrogen displacement was performed three times. The temperature was lowered to −78° C., and then 16.08 mL (2.5M, 40 mmol) of n-BuLi was slowly added dropwise while the temperature was controlled below −65° C., and stirred for 30 min after the addition was finished. Then, 9.44 g (40 mmol) of o-dibromobenzene was dissolved in 60 mL toluene, and then slowly added dropwise to the reaction solution. After the completion of the dropwise addition, the reaction solution was naturally warmed room temperature, and the reaction continued at room temperature for 6 h. After the reaction was quenched by adding ice water (100 mL), the mixture was extracted with 80 mL of DCM twice, and then with saturated brine once. The organic phase was collected and rotary evaporated, and the product was purified by column chromatography (mobile phase: n-hexane:dichloromethane=3:1) to obtain the compound C.

MALDI-TOF: 643.80

$^1$H NMR (500 MHz, CDCl$_3$): δ 7.70 (t, J=4.5 Hz, 2H), 7.65 (s, 4H), 7.64 (s, 2H), 7.26 (s, 2H), 7.20 (d, J=10.0 Hz, 4H).

$^{13}$C NMR (125 MHz, CDCl$_3$): δ 135.33 (s), 134.56 (s), 134.32 (s), 133.26 (s), 132.95 (s), 129.15 (s), 128.29 (d, J=0.9 Hz), 125.70 (s), 121.87 (s), 92.88 (s).

Synthesis of Compound D

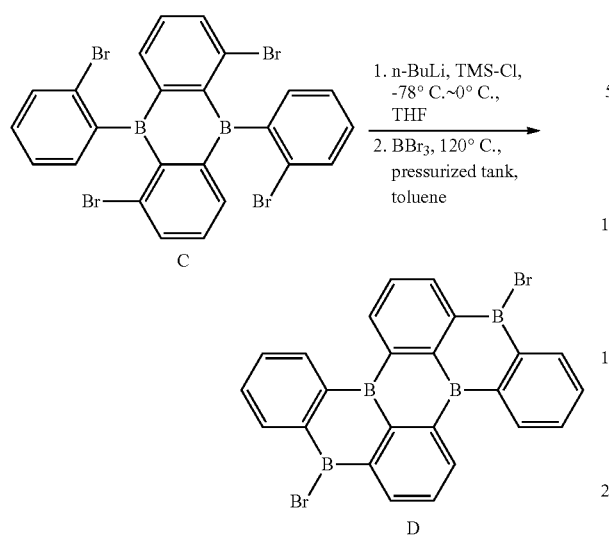

In a 250 ml three-necked flask, 12.87 g (20 mmol) of a substrate C was dissolved with THF (80 mL), and nitrogen displacement was performed three times. The temperature was lowered to −78° C., and then 40 mL (100 mmol) of n-BuLi was slowly added dropwise while the temperature was controlled below −65° C., and the mixture was stirred for 30 min after the dropwise addition was finished. Then, 8.71 g (80 mmol) of TMS-Cl was slowly added dropwise, the temperature was raised to 0° C., and the reaction continued at room temperature for 4 h. Then, the reaction was quenched with ice water, and DCM (80 mL*2) was added for extraction. The organic phase was collected and rotary evaporated to obtain an oil product, and the oil product was then crystallized with toluene/ethanol to obtain a solid. In a 200 mL pressurized tank, 12.34 g (20 mmol) of the solid, anhydrous toluene solution (70 mL) and 2.5 g (10 mmol) of boron tribromide were added sequentially, and stirred for 12 h at 120° C. The reaction was then quenched with H$_2$O (100 mL). The reaction solution was extracted with dichloromethane (DCM) (100 mL*3), and the organic phase was collected, dried, filtered, rotary evaporated to remove the solvent, and crystallized with dichloromethane/ ethanol to obtain a solid D.

MALDI-TOF: 504.99

$^1$H NMR (500 MHz, CDCl$_3$): δ 7.75 (s, 8H), 7.32 (s, 6H).

$^{13}$C NMR (125 MHz, CDCl$_3$): δ 136.12 (s), 134.66 (s), 134.19 (s), 133.29 (s), 127.18 (s), 125.83 (s), 123.78 (s), 116.83 (s), 111.44 (s), 106.98 (s), 96.11 (s).

Synthesis of Compound M4

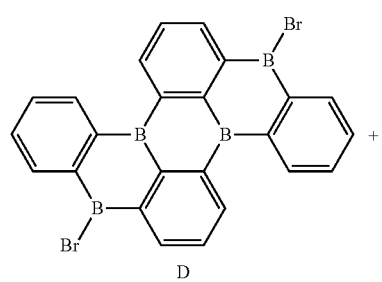

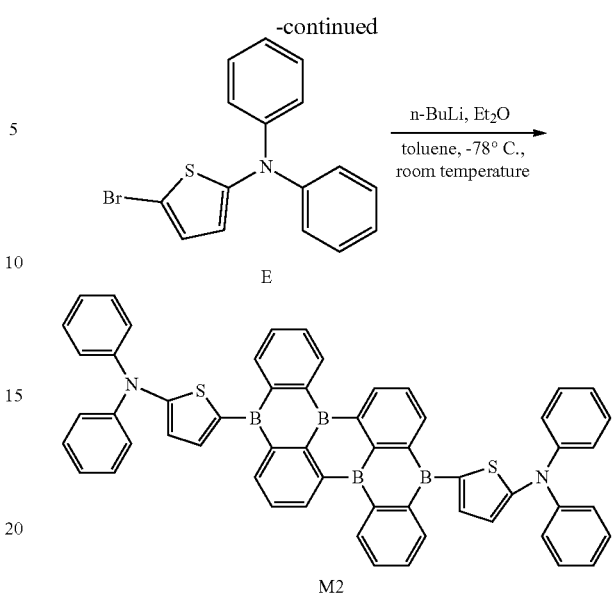

10.11 g (20 mmol) of the compound D was added to a reaction flask, added with ether (150 mL) to dissolve, and nitrogen displacement was performed three times. The temperature was lowered to −78° C., and then 16.08 mL (2.5M, 40 mmol) of n-BuLi was slowly added dropwise while the temperature was controlled below −65° C., and stirred for 30 min after the addition was finished. Then, 13.21 g (40 mmol) of a monomer E was dissolved in 60 mL toluene, and then slowly added dropwise to the reaction solution. After the completion of the dropwise addition, the reaction solution was naturally warmed room temperature, and the reaction continued at room temperature for 6 h. After the reaction was quenched by adding ice water (100 mL), the mixture was extracted with 80 mL of DCM twice, and then with saturated brine once. The organic phase was collected and rotary evaporated, and the product was purified by column chromatography (mobile phase: n-hexane:dichloromethane=3:1) to obtain the compound M4.

MALDI-TOF: 845.29

$^1$H NMR (500 MHz, CDCl$_3$): δ 7.75 (s, 8H), 7.32 (s, 6H), 7.24 (s, 4H), 7.08 (s, 8H), 7.06 (t, J=2.6 Hz, 8H), 7.00 (s, 4H).

$^{13}$C NMR (125 MHz, CDCl$_3$): δ 145.14 (s), 142.79 (s), 140.35 (s), 138.69 (s), 138.06 (s), 136.97 (s), 136.22 (s), 130.39 (s), 128.69 (t, J=9.8 Hz), 126.79 (s), 126.09 (d, J=0.4 Hz), 124.74 (s), 110.38 (s), 101.39 (s), 96.11 (s).

Example 5

The electroluminescent performance of the exemplary boron heterocyclic compounds M1, M2, M3, and M4 according to the present disclosure were simulated by using Gaussian software.

Figure 2:
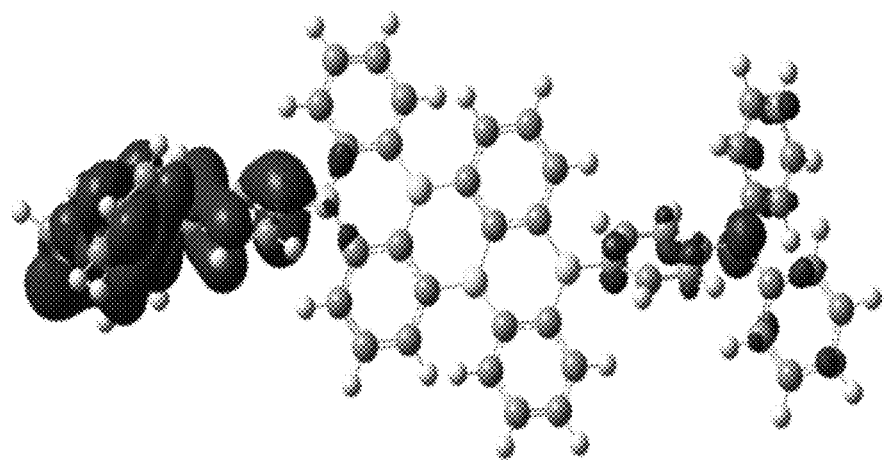
FIG. 2 is a HOMO distribution diagram of the boron heterocyclic compound M1 of the present disclosure.
Figure 3:
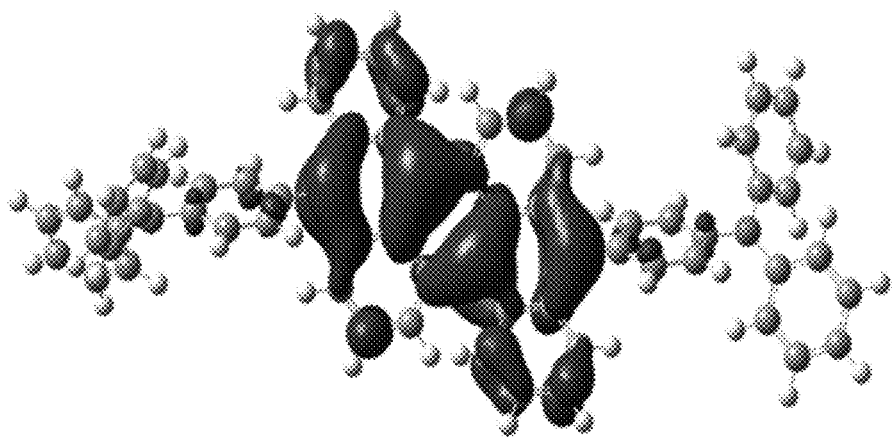
FIG. 3 is a LUMO distribution diagram of the boron heterocyclic compound M1 of the present disclosure.

FIG. 2 and FIG. 3 respectively illustrate the HOMO and LUMO energy levels of the exemplary boron heterocyclic compound M1 of the present disclosure. It can be clearly seen from FIG. 2 and FIG. 3 that the HOMO and LUMO levels of the compound molecule M1 are respectively located on the donor unit and the acceptor unit, thereby completely separate HOMO and LUMO levels. In this way, the intersystem energy difference ΔE$_{ST}$ can be reduced, thereby improving the reverse intersystem crossing ability.

The HOMO level, LUMO level and other parameters of the boron heterocyclic compounds M1, M2, M3 and M4 were measured. The results obtained are shown in Table 1.

TABLE 1

Parameters of four representative boron heterocyclic compounds

| Compound | HOMO (ev) | LUMO (ev) | $S_1$ (ev) | $T_1$ (ev) | $\Delta E_{ST}$ (ev) | τ (μS) |
|---|---|---|---|---|---|---|
| M1 | −5.07 | −2.76 | 2.06 | 1.97 | 0.09 | 5.1 |
| M2 | −5.13 | −2.89 | 2.24 | 2.20 | 0.04 | 2.3 |
| M3 | −5.20 | −2.34 | 2.75 | 2.67 | 0.08 | 1.5 |
| M4 | −5.24 | −2.36 | 2.61 | 2.58 | 0.03 | 2.3 |
| M5 | −5.18 | −2.98 | 2.19 | 2.13 | 0.06 | 3.1 |
| M6 | −5.35 | −3.07 | 2.28 | 2.21 | 0.07 | 1.9 |

As can be seen from Table 1, the boron heterocyclic compounds of the present disclosure have a significantly smaller difference between HOMO and LUMO energy levels, and thus electron transition is more likely to occur.

In yet another aspect, the present disclosure provides a display panel. The display panel includes an organic light-emitting device, and the organic light-emitting device includes an anode, a cathode, a light-emitting layer located between the anode and the cathode. A light-emitting host material or a light-emitting guest material of the light-emitting layer is one or more boron heterocyclic compounds according to the present disclosure.

According to an embodiment of the display panel of the present disclosure, the organic light-emitting device further includes one or more of a hole injection layer, a hole transmission layer, an electron blocking layer, a hole blocking layer, an electron transmission layer, or an electron injection layer.

Figure 4:
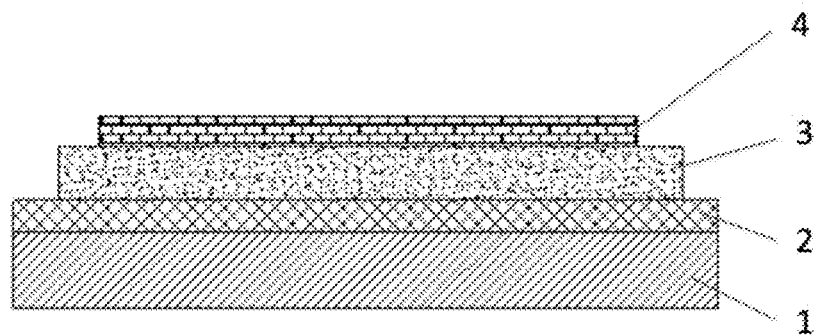
FIG. 4 is a structural schematic diagram of an OLED according to an embodiment of the present disclosure.

I In an embodiment of the display panel of the present disclosure, the organic light-emitting device (OLED) has a structure shown in FIG. 4. In FIG. 4, a substrate made of glass or other suitable material (such as plastic) is denoted with reference number 1; a transparent anode such as ITO or IGZO is denoted with reference number 2 is; an organic film layer, which includes a light-emitting layer, is denoted with reference number 3; and a metal cathode is denoted with reference number 4. All of the above constitutes a complete OLED device.

In the display panel provided by the present disclosure, the anode of the organic light-emitting device can be made of metal such as copper, gold, silver, iron, chromium, nickel, manganese, palladium, platinum, or alloys thereof. The anode can also be made of metal oxides such as indium oxide, zinc oxide, indium tin oxide (ITO), indium zinc oxide (IZO), or the like. The anode can also be made of a conductive polymer such as polyaniline, polypyrrole, poly (3-methylthiophene), or the like. In addition to the anode materials mentioned above, the anode can also be made of any suitable material known in the related art, or combinations thereof, as long as the material is conductive to hole injection.

In the display panel provided by the present disclosure, in an embodiment, the cathode of the organic light-emitting device comprises a metal, such as a metal selected from the group consisting of aluminum, magnesium, silver, indium, tin, titanium, and alloys thereof. In an embodiment, the cathode comprises a multiple-layered metal material, such as a multiple-layered metal material selected from the group consisting of LiF/Al, $LiO_2$/Al, $BaF_2$/Al, and combinations thereof. In addition to the cathode materials listed above, the cathode material also can also be the materials that facilitate electron injection and combinations thereof, including materials known to be suitable for using as the cathode.

In the display panel according to the present disclosure, the organic light-emitting device can be manufactured by the following steps: forming an anode on a transparent or opaque smooth substrate; forming an organic thin layer on the anode; and further forming a cathode on the organic thin layer. The organic thin layer can be formed with a known method such as vapor deposition, sputtering, spin coating, dipping, ion plating, and the like.

Example 6 and Example 7 provide examples for illustrating practical applications of the boron heterocyclic compounds according to the present disclosure in the organic light-emitting display panel.

Example 6

The organic light-emitting device was manufactured by the following steps:

The anode substrate, having an ITO film with a film thickness of 100 nm, was sequentially cleaned with distilled water, acetone, and isopropanol, dried in an oven, subjected to surface treatment with UV for 30 minutes, and then moved to a vacuum evaporation chamber. The film layers were formed by vapor deposition under a vacuum degree of 2×10-6 Pa, respectively. Specifically, PSS was deposited to form a hole injection layer having a thickness of 5 nm, PEDOT was deposited to form a layer having a thickness of 40 nm, and then TAPC was deposited to form a hole transmission layer (HTL) having a thickness of 20 nm. On the hole transmission layer, the boron heterocyclic compound M1 according to the present disclosure was used as a doping material of the light-emitting layer, and 3,3'-bis (N-carbazolyl)-1,1'-biphenyl (mCBP) was used as a host material for the light-emitting layer, and the doping material and the host material were evaporated simultaneously to form a light-emitting layer having a thickness of 35 nm. Then TmPyPb was deposited on the light-emitting layer to form an electron transmission layer (ETL) having a thickness of 50 nm. On the electron transmission layer, a LiF layer having a thickness of 2.5 nm and an Al layer having a thickness of 100 nm, respectively as the electron injection layer (EIL) and the cathode, were sequentially formed by vapor deposition. In this way, the organic light-emitting device was manufactured.

Example 7

For example, the boron heterocyclic compounds M1, M2, M3 and M4 of the present disclosure were used as fluorescent dopants. A light-emitting device D1 was designed to have the following structure:

ITO (100 nm)/PEDOT: PSS (40 nm)/TAPC (20 nm)/ mCBP: M1 (35 nm, 8%)/TmPyPb (50 nm)/LiF (2.5 nm)/Al (100 nm).

Based on the structure of the light-emitting device described above, the light-emitting devices D2, D3, and D4 are designed by replacing the boron heterocyclic compound M1 in the light-emitting device D1 with the boron heterocyclic compounds M2, M3, and M4 of the present disclosure as the fluorescent dopant.

The devices 1 to 4 (D1 to D4) were manufactured with the same method as that of D1. In addition, a comparative device 1 was prepared by using DMQA. In the manufacturing of the comparative device, only the selected dopant was different, the materials of other functional layers were all the same. All the manufactured organic light-emitting devices were applied with DC voltage, and the measurement results of the light-emitting performances of the devices are listed in Table 2.

DMQA has a following structure:

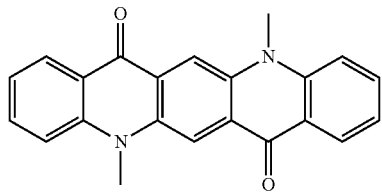 [SMILES: Cn1c2ccccc2c(=O)c2cc3c(cc21)c(=O)c1ccccc1n3C]

TABLE 2

Measurement results of light-emitting performances of the devices

| Device | Compound | Doped? | $V_{turn-on}$ [V] | CE(max) (cd/A) | PE(max) (lm/W) | $EQE_{(max)}$ (%) | CIE (x, y) |
|---|---|---|---|---|---|---|---|
| D1 | M1 | yes | 3.8 | 45.1 | 37.3 | 19.2 | (0.42, 0.55) |
| D2 | M2 | yes | 3.8 | 52.5 | 43.4 | 15.3 | (0.37, 0.53) |
| D3 | M3 | yes | 3.8 | 30.1 | 24.9 | 16.8 | (0.22, 0.44) |
| D4 | M4 | yes | 3.8 | 36.4 | 30.1 | 17.9 | (0.22, 0.42) |
| Comparative device 1 | DMQA | yes | 4.0 | 10.15 | 10.62 | 2.77 | (0.38, 0.58) |

It can be seen from Table 2 that the OLED devices adopting the boron heterocyclic compounds of the present disclosure have higher external quantum efficiency (EQE) up to 19.2%. Compared with the comparative example, the structure of the boron heterocyclic compound of the present disclosure has TADF property, and when it is used in an organic light-emitting device, the triplet excitons, which are blocked in molecular transition of the conventional fluorescent material, can be used to emit light, thereby improving the device efficiency. In addition, the boron heterocyclic compound of the present disclosure has bipolarity, and thus can greatly improve the injection and transmission of two kinds of carriers and improve the carrier balance when it is used as a light-emitting layer, thereby improving the external quantum efficiency. The maximum external quantum efficiency can reach 19.2%.

In yet another aspect, the present disclosure further provides a display apparatus including the organic light-emitting display panel as described above.

Figure 5:
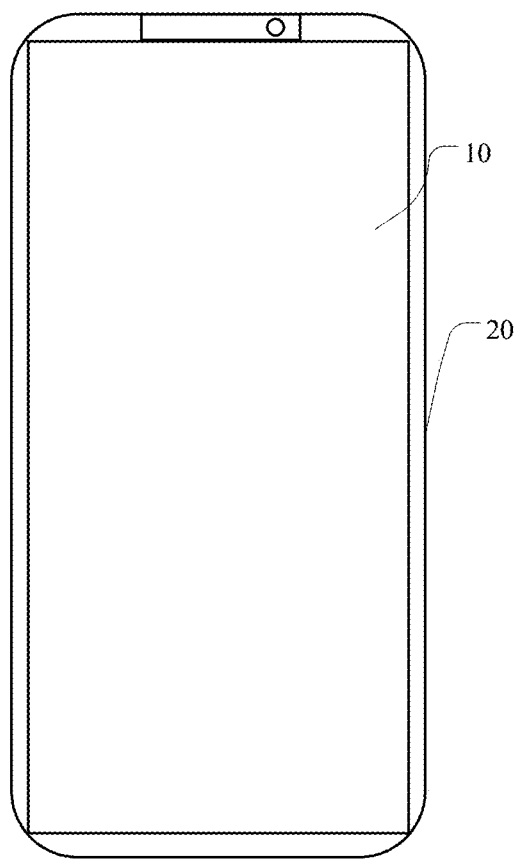
FIG. 5 is a schematic diagram of a display apparatus according to an embodiment of the present disclosure.

In the present disclosure, the organic light-emitting device may be an OLED used in an organic light-emitting display apparatus. The organic light-emitting display apparatus can be display screen of various smart devices, such a mobile phone display screen, a computer display screen, a television display screen, a smart watch display screen, a display panel of smart car, a display screen of Virtual Reality (VR) or Augmented Reality (AR). FIG. 5 is a schematic diagram of a display apparatus according to an embodiment of the present disclosure, in which 10 denotes a mobile phone display panel, and 20 denotes a display apparatus.

The preferable embodiments of the present disclosure described above are not intended to limit the scope of the present disclosure. Those skilled in the art can make various changes and modifications without departing from the scope of the present disclosure. The protection scope of the present disclosure is defined by the appending claims.

What is claimed is:

1. A compound, having a structure according to chemical formula 1:

chemical formula 1

$R_1$—$L_1$—B ... B—$L_2$—$R_2$;

wherein;
$L_1$ and $L_2$ are each independently selected from the group consisting of C6-C30 aryl, C6-C30 fused aryl, C4-C30 heteroaryl, and C4-C30 fused heteroaryl; and
$R_1$ and $R_2$ are each independently selected from the group consisting of C1-C20 alkyl, C3-C20 cycloalkyl, C1-C20 alkoxy, a substituted or unsubstituted phenyl, a substituted or unsubstituted biphenyl, a substituted or unsubstituted naphthyl, a substituted or unsubstituted anthryl, a substituted or unsubstituted phenanthryl, a substituted or unsubstituted acenaphthenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted triphenylenyl, a substituted or unsubstituted benzanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, a substituted or unsubstituted carbazolyl, a substituted or unsubstituted acridinyl, and a substituted or unsubstituted diarylamino.

2. The compound according to claim 1, wherein $L_1$ and $L_2$ are each independently selected from the group consisting of phenylene, naphthylene, anthrylene, phenanthrylene, pyridylidene, furylene, pyrimidinylidene, benzofurylene, thienylene, benzothienylene, pyrrolylene, indolylidene, carbazolylene, oxazolylene, benzoxazolylene, thiazolylene, benzothiazolylene, imidazolylene, benzoimidazolylene, pyrazolylene, indazolylene, quinolylene, and isoquinolylene.

3. The compound according to claim 1, wherein $L_1$ and $L_2$ are identical.

4. The compound according to claim 1, wherein $R_1$ and $R_2$ are identical.

5. The compound according to claim 1, wherein $R_1$ and $R_2$ are each independently selected from the following formulas:

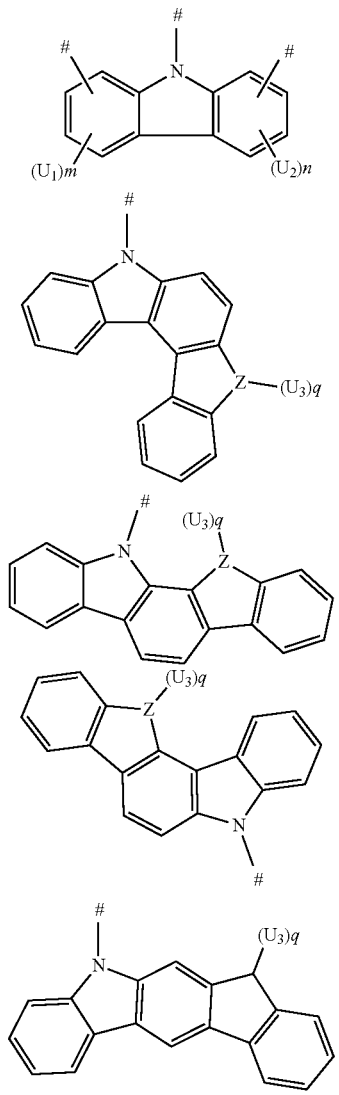

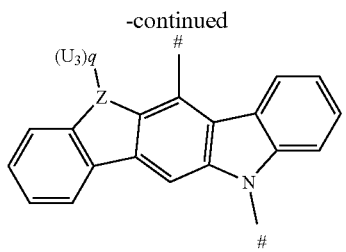

wherein
Z is selected from the group consisting of C, N, O, and S;
q, m, and n are each an integer selected from 0, 1, or 2;
$U_1$, $U_2$ and $U_3$ are each independently selected from the group consisting of a hydrogen atom, C1-C6 alkyl, C1-C6 alkoxy, and C6-C12 aryl;
when Z is O or S, q is 0; and
# indicates a bonding position.

6. The compound according to claim 5, wherein $R_1$ and $R_2$ are each independently selected from the following groups:

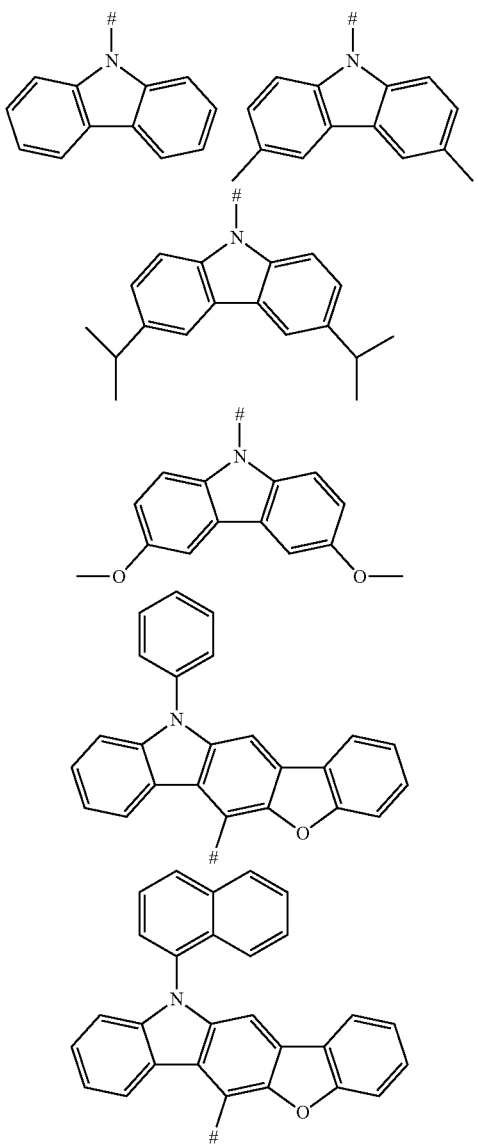

-continued
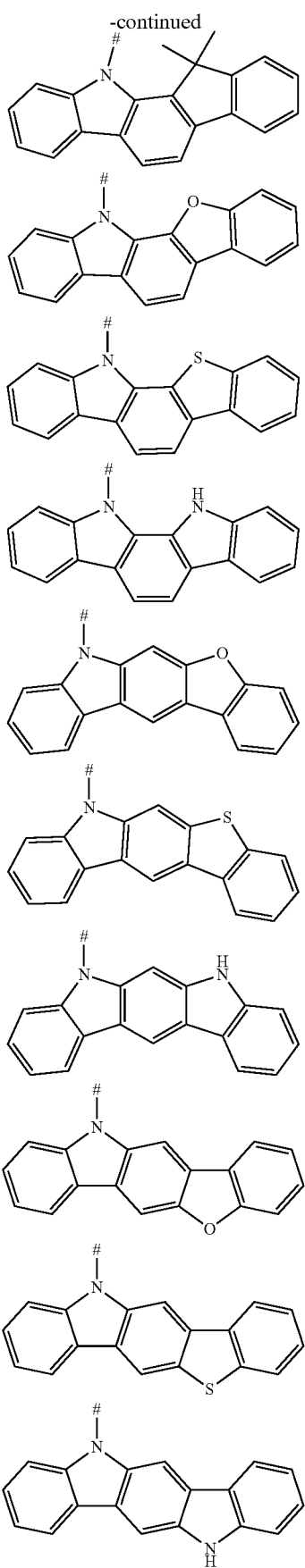
-continued
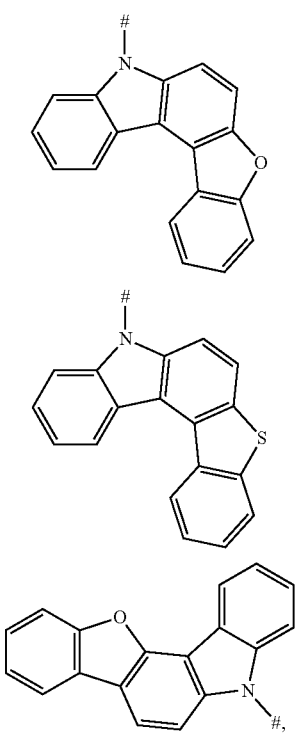
wherein # indicates a bonding position.
7. The compound according to claim 1, wherein $R_1$ and $R_2$ are each independently selected from the following formulas:
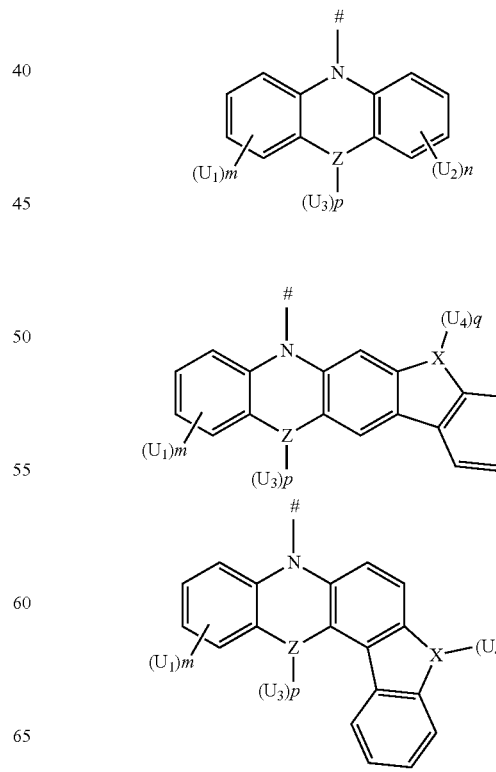

-continued

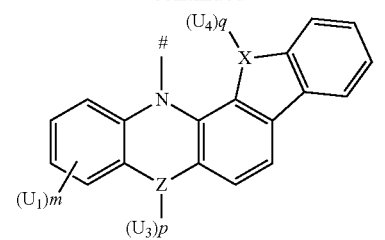

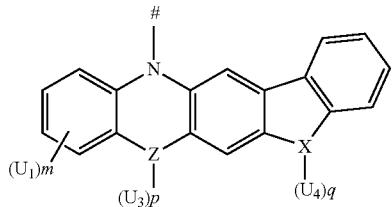

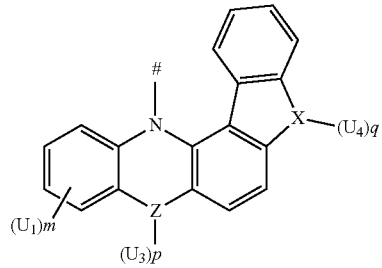

wherein

Z and X are each independently selected from the group consisting of C, N, O, S, and Si;

m, n, p, and q are each an integer independently selected from 0, 1, or 2;

$U_1$, $U_2$, $U_3$, $U_4$ are each independently selected from the group consisting of a hydrogen atom, C1-C6 alkyl, C3-C6 cycloalkyl, C1-C6 alkoxy, C6-C12 aryl, and C12-C20 substituted or unsubstituted diphenylamino;

when Z is O or S, p is 0;

when X is O or S, q is 0; and # indicates a bonding position.

8. The compound according to claim 7, wherein $R_1$ and $R_2$ are each independently selected from the following formulas:

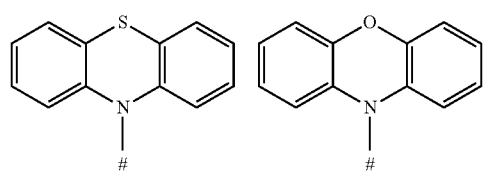

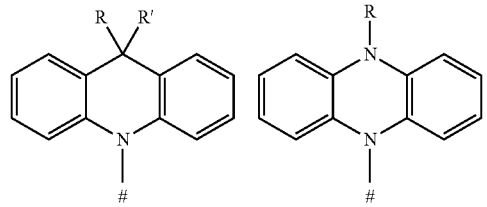

-continued

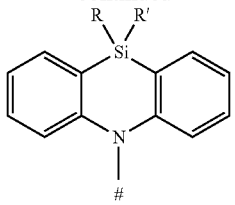

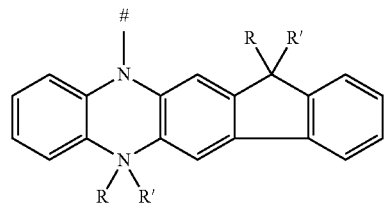

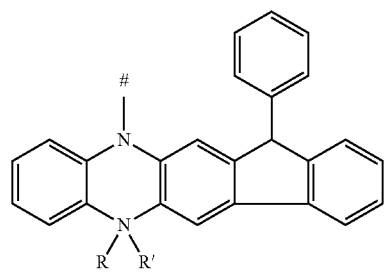

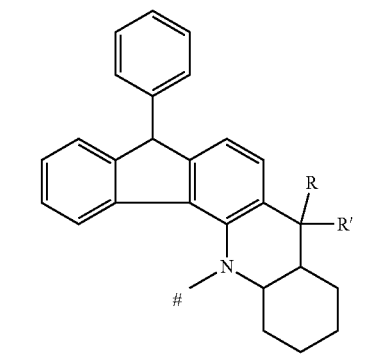

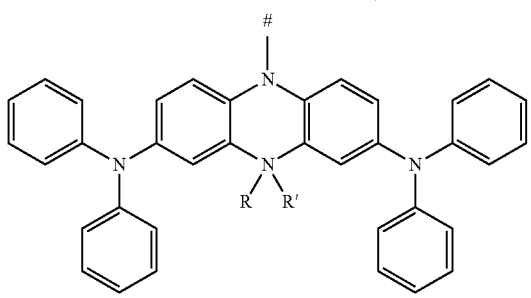

wherein R and R' are each independently selected from the group consisting of a hydrogen atom, C1-C6 alkyl, C1-C6 alkoxy, C1-C6 cycloalkyl, C6-C12 aryl, and C4-C12 heteroaryl; and # indicates a bonding position.

9. The compound according to claim 1, wherein $R_1$ and $R_2$ are each independently according to the following formula:

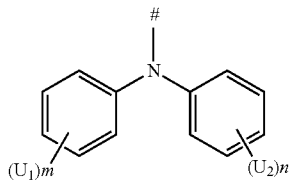

wherein $U_1$, $U_2$ are each independently selected from the group consisting of a hydrogen atom, C1-C6 alkyl, and C1-C6 alkoxy;

m and n are each an integer independently selected from 0, 1, or 2; and # indicates a bonding position.

10. The compound according to claim 9, wherein $R_1$ and $R_2$ are each independently selected from the following groups:

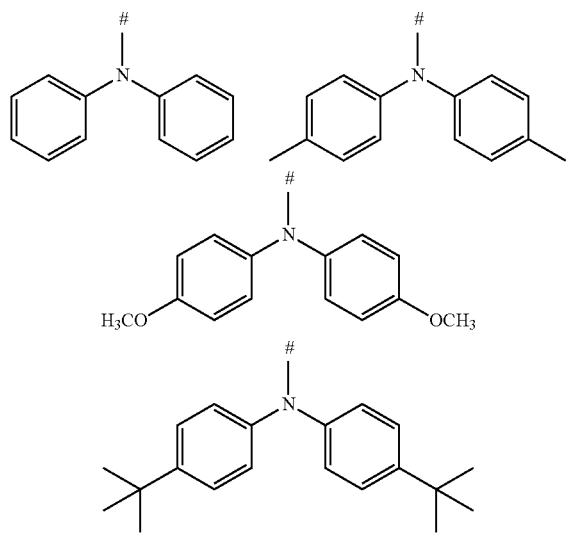

wherein # indicates a bonding position.

11. The compound according to claim 1, wherein $R_1$ and $R_2$ are each independently selected from the following formulas:

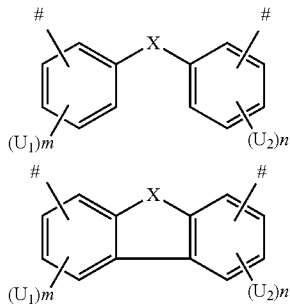

wherein

X is O or S;

m and n are each an integer independently selected from 0, 1, or 2;

$U_1$ and $U_2$ are each independently selected from the group consisting of a hydrogen atom, C1-C6 alkyl, C3-C6 cycloalkyl, and C1-C6 alkoxy; and # indicates a bonding position.

12. The compound according to claim 11, wherein $R_1$ and $R_2$ are each independently selected from the following groups:

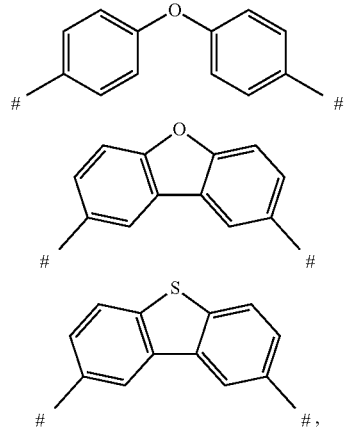

wherein # indicates a bonding position.

13. The compound according to claim 1, wherein $L_1$ and $L_2$ are each independently selected from the following groups:

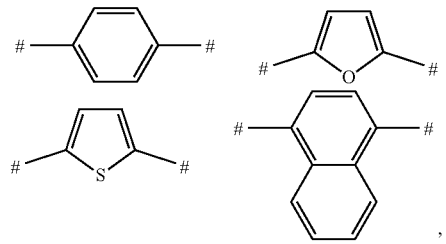

wherein $R_1$ and $R_2$ are each independently selected from the following formulas:

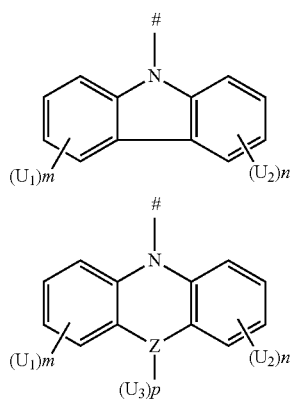

-continued

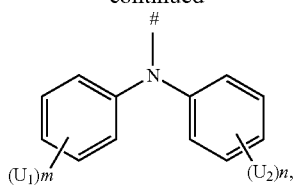

wherein
U₁, U₂ and U₃ are each independently selected from the group consisting of C1-C3 alkyl, and C6-C12 aryl;
m and n are 0;
p is an integer selected from 0, 1, or 2;
Z is selected from the group consisting of C, N, O, and S,
when Z is O or S, p or q is 0; and
# indicates a bonding position.

14. The compound according to claim 1, wherein L₁ and L₂ are each independently selected from the following formulas:

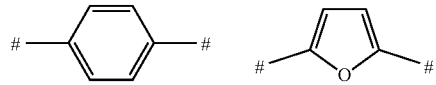

-continued

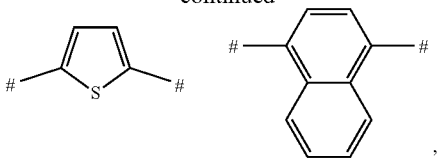

wherein R₁ and R₂ are each independently selected from the following formulas:

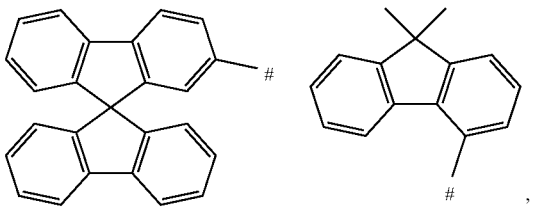

wherein # indicates a bonding position.

15. The compound according to claim 1, wherein the compound is selected from the following compounds:

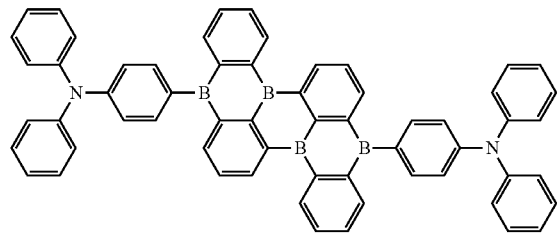
M1

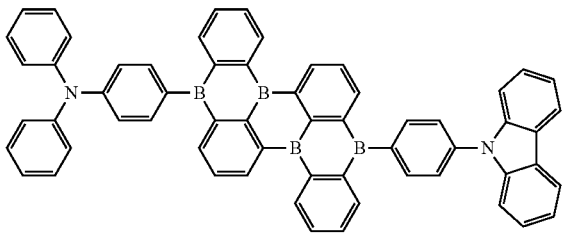
M2

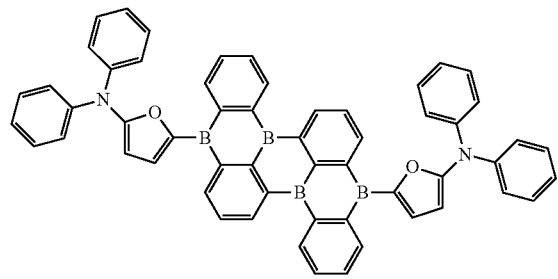
M3

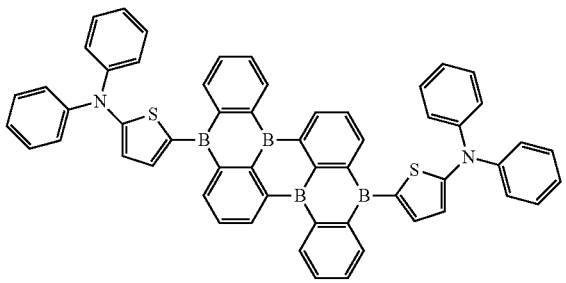
M4

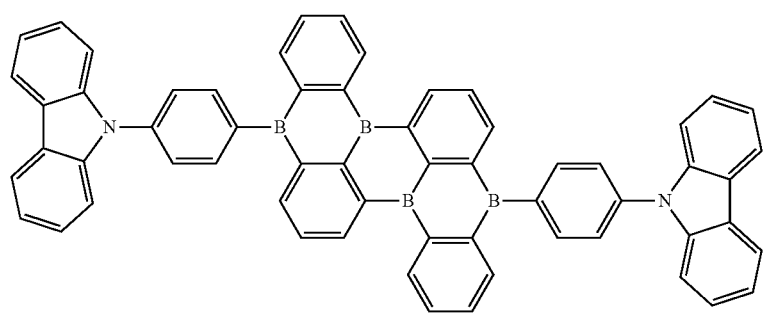
M5

-continued
M6
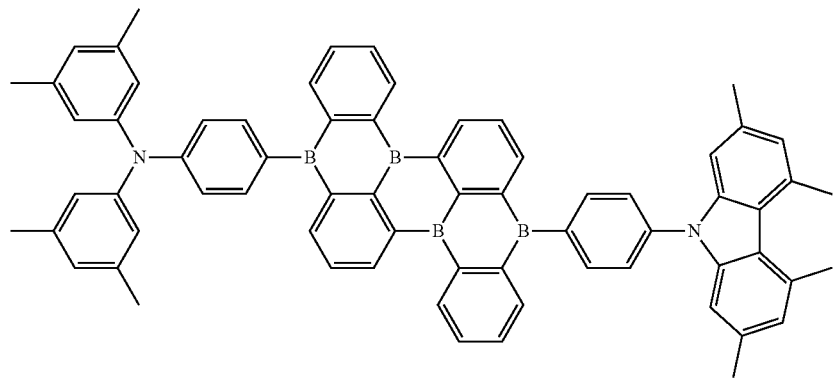
M7
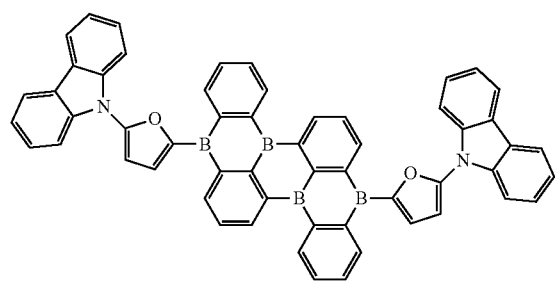
M8
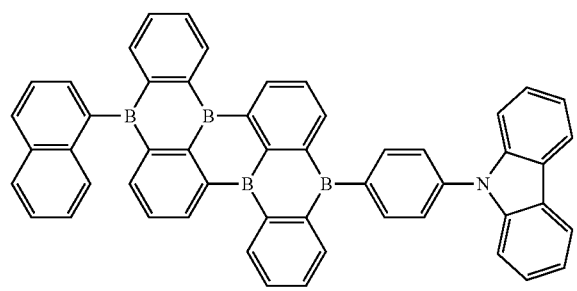
M9
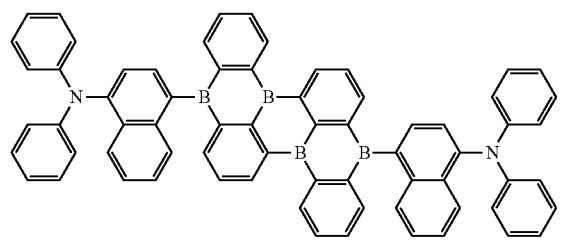
M10
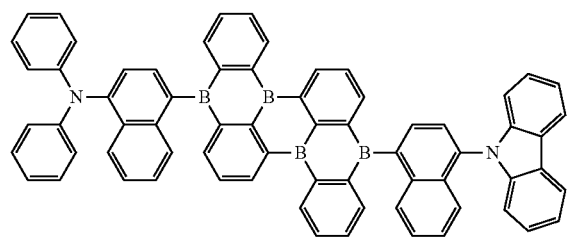
M11
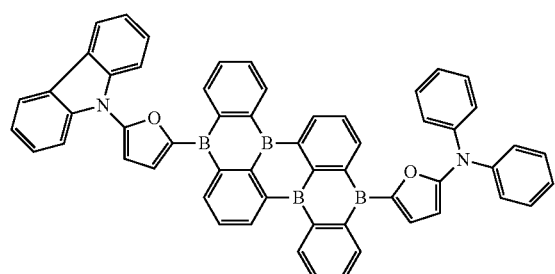
M12
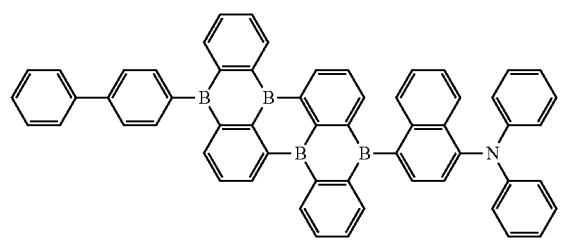
M13
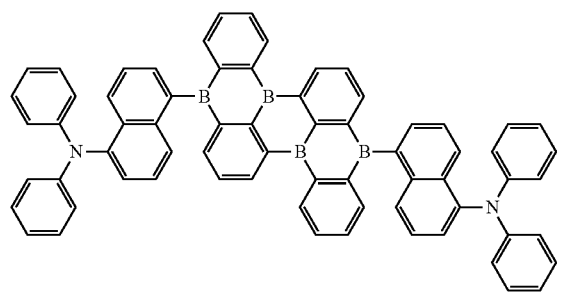
M14
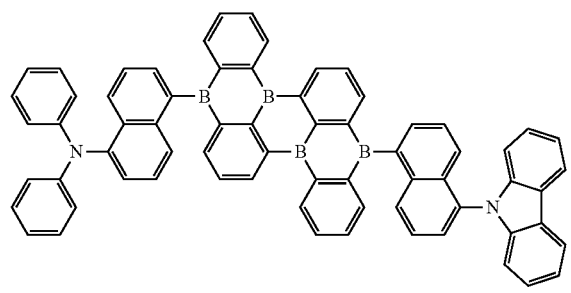

-continued
M15
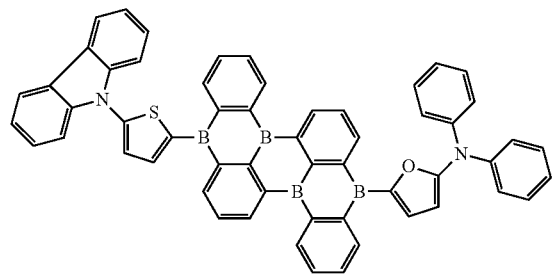
M16
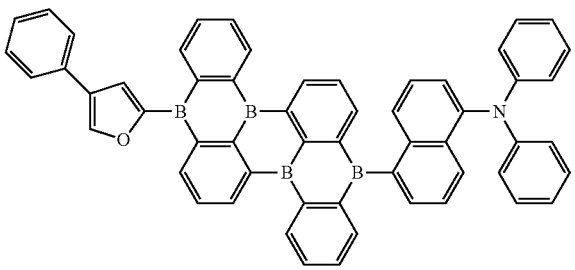
M17
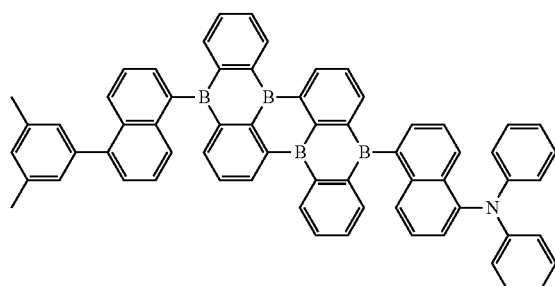
M18
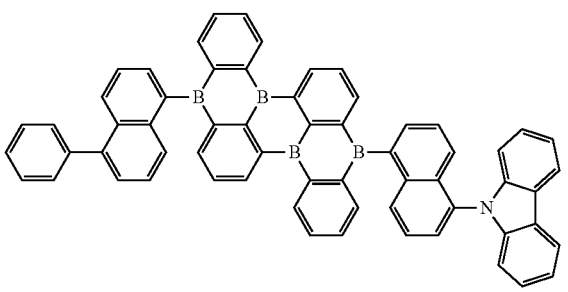
M19
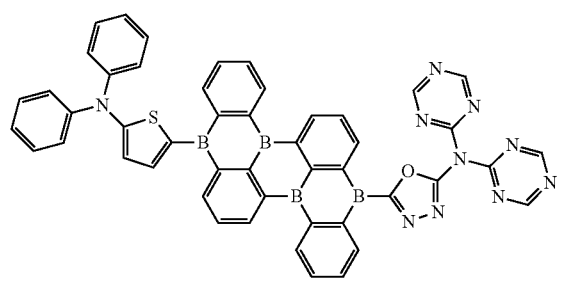
M20
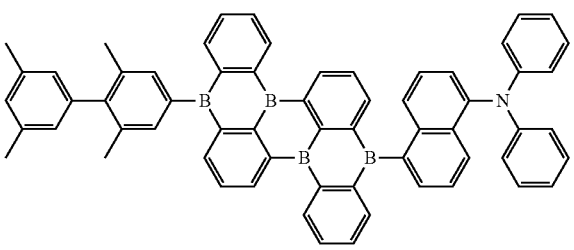
M21
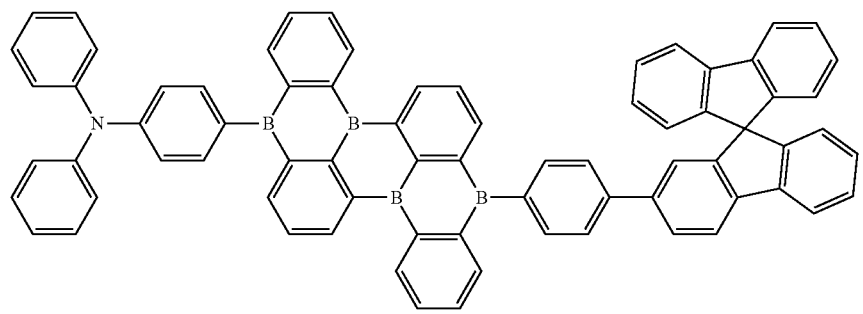
M22
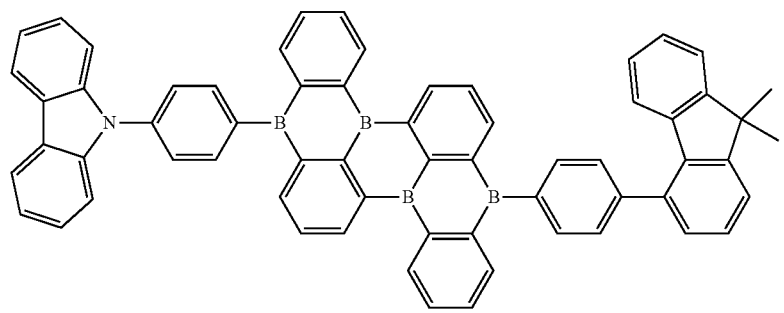

M23
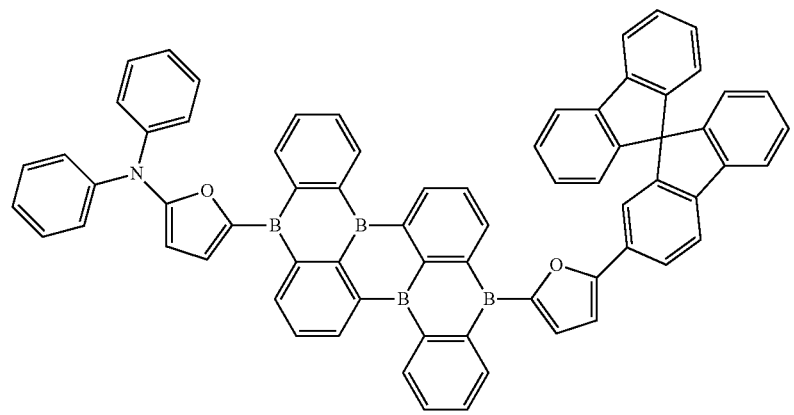
M24
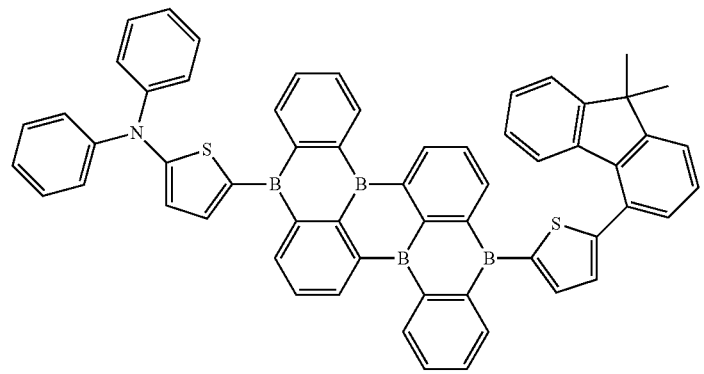
M21
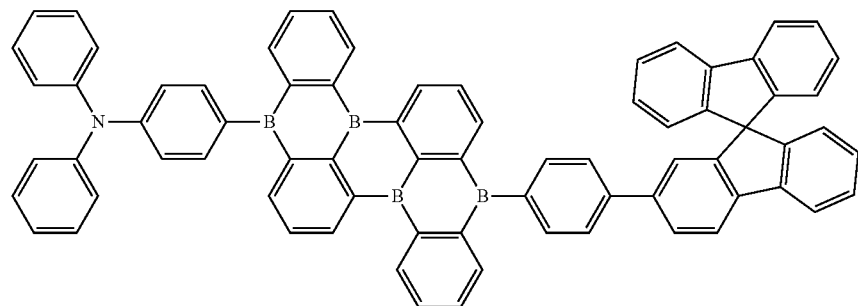
M22
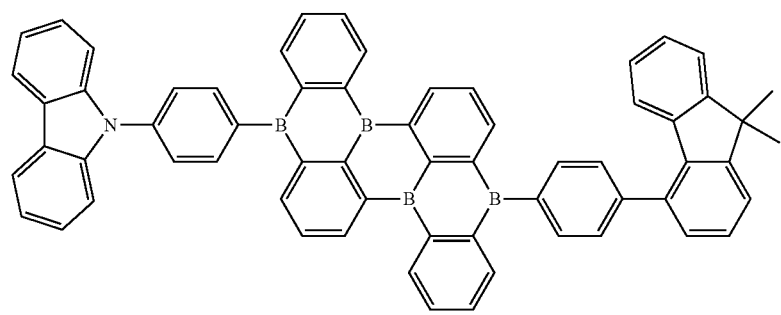

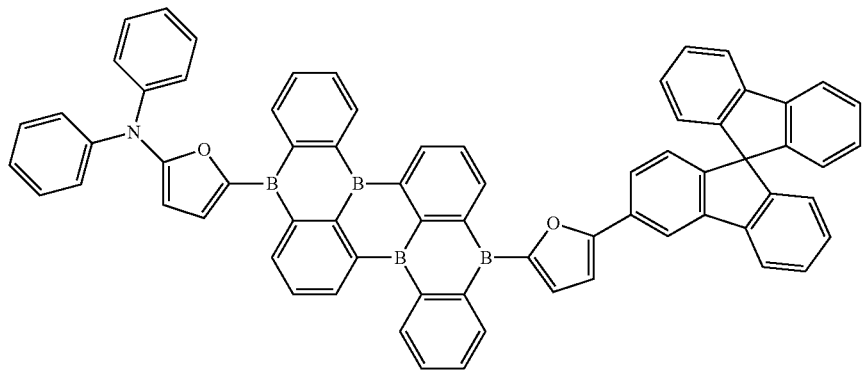

M23

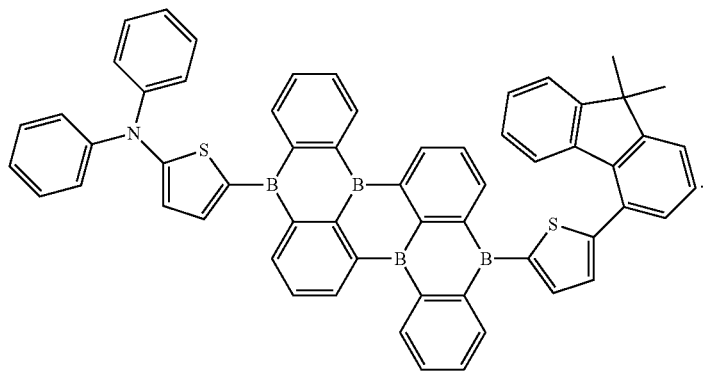

M24

16. The compound according to claim 1, wherein an energy level difference between an energy level, $E_{S1}$, of a lowest singlet level, S1, and an energy level, $E_{T1}$, of a lowest triplet level, T1, of the compound satisfies: $\Delta E_{S1} = E_{S1} - E_{T1} \leq 0.25$ eV.

17. A display panel, comprising an organic light-emitting device, wherein the organic light-emitting device comprises an anode, a cathode, and a light-emitting layer disposed between the anode and the cathode, wherein a light-emitting host material or a light-emitting guest material of the light-emitting layer is one or more compounds according to claim 16.

18. A display apparatus, comprising the display panel according to claim 17.

* * * * *